(12) United States Patent
Kume

(10) Patent No.: US 12,405,355 B2
(45) Date of Patent: Sep. 2, 2025

(54) LIGHT-RECEIVING DEVICE AND METHOD FOR MANUFACTURING LIGHT-RECEIVING DEVICE

(71) Applicant: HAMAMATSU PHOTONICS K.K., Hamamatsu (JP)

(72) Inventor: Makio Kume, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 1037 days.

(21) Appl. No.: 17/310,940

(22) PCT Filed: Mar. 4, 2020

(86) PCT No.: PCT/JP2020/009242
§ 371 (c)(1),
(2) Date: Sep. 1, 2021

(87) PCT Pub. No.: WO2020/179839
PCT Pub. Date: Sep. 10, 2020

(65) Prior Publication Data
US 2022/0155417 A1    May 19, 2022

(30) Foreign Application Priority Data
Mar. 5, 2019    (JP) .................................. 2019-039344

(51) Int. Cl.
*G01S 7/481* (2006.01)
*G02B 5/18* (2006.01)
(Continued)

(52) U.S. Cl.
CPC .......... *G01S 7/4811* (2013.01); *G02B 5/1857* (2013.01); *H10F 71/00* (2025.01);
(Continued)

(58) Field of Classification Search
None
See application file for complete search history.

(56) References Cited

U.S. PATENT DOCUMENTS

| 5,275,330 A | 1/1994 | Isaacs et al. |
| 6,087,597 A | 7/2000 | Shimada et al. |

(Continued)

FOREIGN PATENT DOCUMENTS

| JP | S60-060756 A | 4/1985 |
| JP | 2000-277023 A | 10/2000 |

(Continued)

OTHER PUBLICATIONS

Wataru Watanabe et al., "Fabrication of Fresnel zone plate embedded in silica glass by femtosecond laser pulses", Optics Express, vol. 10, No. 19, Sep. 23, 2002, p. 978, XP055084832.

(Continued)

*Primary Examiner* — Eric L Bolda
(74) *Attorney, Agent, or Firm* — Faegre Drinker Biddle & Reath LLP

(57) ABSTRACT

A light-receiving device includes a light-receiving element in which a plurality of light-receiving portions are provided; and a glass cover that has a first surface and a second surface opposite to the first surface and that is fixed above the light-receiving element such that the second surface faces the light-receiving element. The glass cover includes a plurality of diffraction gratings provided in at least one of the first surface and an inside of the glass cover. Each of the plurality of diffraction gratings is configured to concentrate laser light for distance measurement on each of the plurality of light-receiving portions, the laser light for distance measurement incident on the first surface of the glass cover.

14 Claims, 25 Drawing Sheets

(51) Int. Cl.
*H10F 71/00* (2025.01)
*H10F 77/00* (2025.01)
*H10F 77/40* (2025.01)
*H10F 77/50* (2025.01)
*G02B 27/00* (2006.01)
*G02B 27/42* (2006.01)

(52) U.S. Cl.
CPC .......... *H10F 77/407* (2025.01); *H10F 77/50* (2025.01); *H10F 77/933* (2025.01); *G02B 27/0037* (2013.01); *G02B 27/4227* (2013.01)

(56) References Cited

U.S. PATENT DOCUMENTS

| | | | |
|---|---|---|---|
| 2012/0132809 A1* | 5/2012 | Findlay | G01J 1/4228 250/353 |
| 2014/0350836 A1 | 11/2014 | Stettner et al. | |
| 2016/0225812 A1 | 8/2016 | Elkhatib et al. | |
| 2016/0266242 A1 | 9/2016 | Gilliland et al. | |
| 2017/0363722 A1 | 12/2017 | Yonehara et al. | |
| 2018/0143359 A1* | 5/2018 | Channon | G02B 1/14 |
| 2018/0299554 A1 | 10/2018 | Van Dyck et al. | |
| 2018/0335555 A1 | 11/2018 | Wang et al. | |

FOREIGN PATENT DOCUMENTS

| | | |
|---|---|---|
| JP | 2015-007615 A | 1/2015 |
| JP | 2016-058435 A | 4/2016 |
| JP | 2016-157901 A | 9/2016 |
| JP | 2017-224755 A | 12/2017 |
| JP | 2018-531374 A | 10/2018 |
| JP | 2019-012138 A | 1/2019 |
| WO | WO-2013/069227 A1 | 5/2013 |
| WO | WO-2017/068199 A1 | 4/2017 |
| WO | WO-2018/137950 A1 | 8/2018 |

OTHER PUBLICATIONS

Xiao D. B. et al., "UV laser dicing without failure caused by contamination and heat for thick anodically bonded silicon/glass MEMS wafers", 2011 16th International Solid-State Sensors, Actuators and Microsystems Conference (Transducers 2011); Beijing, China; Jun. 5-9, 2011, IEEE, Piscataway, NJ, Jun. 5, 2011, p. 2339-p. 2342, XP031910876.

International Preliminary Report on Patentability mailed Sep. 16, 2021 for PCT/JP2020/009242.

* cited by examiner (a)

(b)

(a)

(b)

(a)

(b)

LIGHT-RECEIVING DEVICE AND METHOD FOR MANUFACTURING LIGHT-RECEIVING DEVICE

TECHNICAL FIELD

The present disclosure relates to a light-receiving device and a method for manufacturing a light-receiving device.

BACKGROUND ART

As a technique for measuring the distance to an object using a time of flight (TOF) method, a light detection and ranging (LiDAR) system has attracted attention. For this reason, various technical developments have been made on a light-receiving device used in the LiDAR system (for example, refer to Patent Literature 1).

CITATION LIST

Patent Literature

Patent Literature 1: Japanese Unexamined Patent Publication No. 2017-224755

SUMMARY OF INVENTION

Technical Problem

In the LiDAR system, it is important how accurately the light-receiving device can receive laser light for distance measurement that is emitted from a light source and is reflected by an object. Meanwhile, it is not desirable that the thickness of the light-receiving device is increased to accurately receive the laser light for distance measurement.

An object of the present disclosure is to provide a light-receiving device that can accurately receive laser light for distance measurement and can be made thin, and a method for manufacturing such a light-receiving device.

Solution to Problem

A light-receiving device according to one aspect of the present disclosure includes: a light-receiving element in which a plurality of light-receiving portions are provided; and a glass cover that has a first surface and a second surface opposite to the first surface and that is fixed above the light-receiving element such that the second surface faces the light-receiving element. The glass cover includes a plurality of diffraction gratings provided in at least one of the first surface and an inside of the glass cover. Each of the plurality of diffraction gratings is configured to concentrate laser light for distance measurement on each of the plurality of light-receiving portions, the laser light for distance measurement incident on the first surface of the glass cover.

In the light-receiving device, the glass cover includes the plurality of diffraction gratings, and each of the plurality of diffraction gratings is configured to concentrate the laser light for distance measurement on each of the plurality of light-receiving portions, the laser light for distance measurement incident on the glass cover. Accordingly, a reduction in crosstalk between the adjacent light-receiving portions and an improvement in sensitivity of each of the plurality of light-receiving portions can be achieved. Moreover, the plurality of diffraction gratings are provided in at least one of the first surface and the inside of the glass cover. Accordingly, it is not necessary to provide, as a separate member, a light-concentrating element between the light-receiving element and the glass cover. In addition, since the distance from the light-receiving element to the plurality of diffraction gratings is larger than that when the plurality of diffraction gratings are provided in the second surface of the glass cover, the glass cover can be fixed above the light-receiving element in a state where the glass cover is placed closer to the light-receiving element. As a result, the light-receiving device can accurately receive the laser light for distance measurement, and can be made thin.

In the light-receiving device according to one aspect of the present disclosure, the glass cover may be fixed above the light-receiving element in a state where the glass cover is separated from the light-receiving element. Accordingly, the distance from the light-receiving element to the plurality of diffraction gratings can be set to an appropriate distance, and the laser light for distance measurement incident on the glass cover can be reliably concentrated on each of the plurality of light-receiving portions.

In the light-receiving device according to one aspect of the present disclosure, the glass cover may be fixed on the light-receiving element in a state where the glass cover is in contact with the light-receiving element. Accordingly, the device can be made thinner.

The light-receiving device according to one aspect of the present disclosure may further include a light source that emits the laser light for distance measurement. Each of the plurality of diffraction gratings may be configured to concentrate the laser light for distance measurement on each of the plurality of light-receiving portions, the laser light for distance measurement emitted from the light source and reflected by an object. Accordingly, the distance to the object can be accurately measured.

In the light-receiving device according to one aspect of the present disclosure, the glass cover may include a glass substrate and a first film provided on a surface on a first surface side of the glass substrate. The plurality of diffraction gratings may be formed in the first film. Accordingly, the distance from the light-receiving element to the plurality of diffraction gratings can be set to an appropriate distance, and the laser light for distance measurement incident on the glass cover can be reliably concentrated on each of the plurality of light-receiving portions.

In the light-receiving device according to one aspect of the present disclosure, the glass cover may include a glass substrate, and the plurality of diffraction gratings may be formed in a surface on a first surface side of the glass substrate. Accordingly, the distance from the light-receiving element to the plurality of diffraction gratings can be set to an appropriate distance, and the laser light for distance measurement incident on the glass cover can be reliably concentrated on each of the plurality of light-receiving portions.

In the light-receiving device according to one aspect of the present disclosure, the glass cover may further include a filter disposed on a side opposite to the light-receiving element with respect to the plurality of diffraction gratings. The filter may have transmission properties for the laser light for distance measurement, and have light shielding properties for light having wavelengths other than a wavelength of the laser light for distance measurement. In such a manner, since the filter is provided in a previous stage of the plurality of diffraction gratings, the light having the wavelengths other than the wavelength of the laser light for distance measurement can be reliably cut, and the SN ratio of the light-receiving element can be improved.

The light-receiving device according to one aspect of the present disclosure may further include a substrate that has an inside surface on which the light-receiving element is disposed, an outside surface opposite to the inside surface, and a through-hole being open to the inside surface and the outside surface and that forms, together with the glass cover, a package that houses the light-receiving element; a metallic film provided on an inner surface of the through-hole; a metallic ball disposed in the through-hole; and a solder member that is disposed between the metallic film and the metallic ball in the through-hole and that fixes the metallic ball in the through-hole. The through hole may include an inside opening portion located in the inside surface, an outside opening portion located in the outside surface, and an intermediate opening portion located between the inside surface and the outside surface. The outside opening portion may have a shape through which the metallic ball is passable. The intermediate opening portion may have a shape through which the metallic ball is not passable. The metallic film may include a cylindrical portion provided on a side surface of the inner surface of the through-hole, the side surface being located between the outside opening portion and the intermediate opening portion. The metallic ball may be disposed in the through-hole to be surrounded by the cylindrical portion. The solder member may seal an area between the cylindrical portion and the metallic ball in a state where the solder member extends from the metallic ball to the cylindrical portion. Accordingly, during manufacturing of the light-receiving device, for example, while degassing the inside of the package through the through-hole, the metallic ball can be fixed in the through-hole by the solder member, and the area between the cylindrical portion of the metallic film and the metallic ball can be sealed by the solder member. At this time, since at least a part of the intermediate opening portion of the through-hole is closed by the metallic ball, the molten solder member can be suppressed from infiltrating into the package. Further, the intermediate opening portion of the through-hole has a shape through which the metallic ball is not passable, and in a state where the solder member extends from the metallic ball to the cylindrical portion of the metallic film, the area between the cylindrical portion of the metallic film and the metallic ball is sealed by the solder member. Accordingly, in the manufactured light-receiving device, the fixed state of the metallic ball is stabilized, so that the sealing state of the through-hole can be reliably maintained.

In the light-receiving device according to one aspect of the present disclosure, the intermediate opening portion may have a long shape. Accordingly, during manufacturing of the light-receiving device, when the metallic ball is fixed in the through-hole by the solder member, a part of the intermediate opening portion of the through-hole is not closed by the metallic ball, so that the inside of the package can be reliably degassed through the through-hole.

In the light-receiving device according to one aspect of the present disclosure, the through-hole may be a tapered hole that widens from the inside surface toward the outside surface. Accordingly, the through-hole including the outside opening portion having a shape through which the metallic ball is passable and the intermediate opening portion having a shape through which the metallic ball is not passable can be easily and reliably obtained.

In the light-receiving device according to one aspect of the present disclosure, the through-hole may be a stepped hole that is widened in width on an outside surface side. Accordingly, the through-hole including the outside opening portion having a shape through which the metallic ball is passable and the intermediate opening portion having a shape through which the metallic ball is not passable can be easily and reliably obtained.

In the light-receiving device according to one aspect of the present disclosure, the metallic film may further include a flange portion provided on the outside surface to extend along an outer edge of the outside opening portion. The cylindrical portion may be connected to the flange portion. Accordingly, when a mounting substrate on which the light-receiving device is to be mounted is provided with a metallic pattern corresponding to the outside opening portion of the through-hole and the flange portion of the metallic film, and the flange portion is joined to the metallic pattern, even if the metallic ball falls on the metallic pattern during joining, the sealing state of the through-hole in the light-receiving device after mounting can be reliably maintained.

In the light-receiving device according to one aspect of the present disclosure, a surface on an outside opening portion side of the solder member may be a curved surface that is recessed to an inside opening portion side in the area between the cylindrical portion and the metallic ball. Accordingly, the local concentration of stress can be suppressed from occurring in the solder member, and the sealing state of the through-hole can be more reliably maintained.

According to one aspect of the present disclosure, there is provided a method for manufacturing a light-receiving device, the method including: a first step of preparing a light-receiving element in which a plurality of light-receiving portions are provided, and a glass cover having a first surface and a second surface opposite to the first surface; a second step of disposing the glass cover above the light-receiving element such that the second surface faces the light-receiving element, after the first step; and a third step of forming a plurality of light-concentrating elements in the glass cover by irradiating the glass cover with laser light for processing after the second step. In the third step, each of the plurality of light-concentrating elements is formed such that the plurality of light-concentrating elements concentrate laser light for distance measurement on each of the plurality of light-receiving portions, the laser light for distance measurement incident on the first surface of the glass cover.

In the method for manufacturing the light-receiving device, the plurality of light-concentrating elements are formed in the glass cover by disposing the glass cover above the light-receiving element and then irradiating the glass cover with the laser light for processing. Accordingly, the light-receiving device in which each of the plurality of light-concentrating elements is accurately positioned with respect to each of the plurality of light-receiving portions can be efficiently obtained. As a result, according to the method for manufacturing the light-receiving device, the light-receiving device described above can be appropriately manufactured.

In the method for manufacturing a light-receiving device according to one aspect of the present disclosure, in the second step, the glass cover may be fixed above the light-receiving element such that the glass cover is separated from the light-receiving element. Accordingly, in the manufactured light-receiving device, the distance from the light-receiving element to the plurality of light-concentrating elements can be set to an appropriate distance, and the laser light for distance measurement incident on the glass cover can be reliably concentrated on each of the plurality of light-receiving portions.

In the method for manufacturing a light-receiving device according to one aspect of the present disclosure, in the second step, the glass cover may be fixed on the light-receiving element such that the glass cover is in contact with the light-receiving element. Accordingly, the manufactured light-receiving device can be made thinner.

In the method for manufacturing a light-receiving device according to one aspect of the present disclosure, the glass cover may include a glass substrate and a first film provided on a surface on a first surface side of the glass substrate. In the third step, the plurality of light-concentrating elements may be formed in the first film. Accordingly, the influence of the irradiation of the laser light for processing on the light-receiving element can be suppressed.

In the method for manufacturing a light-receiving device according to one aspect of the present disclosure, the plurality of light-concentrating elements may be a plurality of diffraction gratings. Accordingly, the plurality of light-concentrating elements can be easily provided in the glass cover by the irradiation of the laser light for processing.

In the method for manufacturing a light-receiving device according to one aspect of the present disclosure, the glass cover may include a glass substrate. In the third step, the plurality of light-concentrating elements may be formed in the glass substrate. Accordingly, various light-concentrating elements can be provided in the glass cover by the irradiation of the laser light for processing.

In the method for manufacturing a light-receiving device according to one aspect of the present disclosure, in the third step, the plurality of light-concentrating elements may be formed in a surface on a first surface side of the glass substrate. Accordingly, the influence of the irradiation of the laser light for processing on the light-receiving element can be suppressed.

In the method for manufacturing a light-receiving device according to one aspect of the present disclosure, the plurality of light-concentrating elements may be a plurality of diffraction gratings. Accordingly, the plurality of light-concentrating elements can be easily provided in the glass cover by the irradiation of the laser light for processing.

In the method for manufacturing a light-receiving device according to one aspect of the present disclosure, in the third step, the plurality of light-concentrating elements may be formed inside the glass substrate. Accordingly, the influence of the irradiation of the laser light for processing on the light-receiving element can be suppressed.

In the method for manufacturing a light-receiving device according to one aspect of the present disclosure, the plurality of light-concentrating elements may be a plurality of diffraction gratings, a plurality of lens surfaces, or a plurality of light-guiding portions. Accordingly, appropriate light-concentrating elements according to the application can be provided in the glass cover.

In the method for manufacturing a light-receiving device according to one aspect of the present disclosure, the glass cover may include a glass substrate and a second film provided on a surface on a second surface side of the glass substrate. The second film may have transmission properties for the laser light for distance measurement, and have light shielding properties for the laser light for processing. Accordingly, the influence of the irradiation of the laser light for processing on the light-receiving element can be more reliably suppressed.

In the method for manufacturing a light-receiving device according to one aspect of the present disclosure, the glass cover may include a glass substrate. The glass substrate may have transmission properties for the laser light for distance measurement, and have light shielding properties for the laser light for processing. Accordingly, the influence of the irradiation of the laser light for processing on the light-receiving element can be more reliably suppressed.

In the method for manufacturing a light-receiving device according to one aspect of the present disclosure, in the first step, a semiconductor wafer including a plurality of portions that become the light-receiving elements, and a glass wafer including a plurality of portions that become the glass covers may be prepared. In the second step, the glass wafer may be fixed on the semiconductor wafer. In the third step, the plurality of light-concentrating elements may be formed for each of the portions, which become the light-receiving elements, by irradiating the glass wafer with the laser light for processing. Accordingly, the plurality of light-concentrating elements can be efficiently formed by the irradiation of the laser light for processing.

The method for manufacturing a light-receiving device according to one aspect of the present disclosure may further include a fourth step of cutting the semiconductor wafer and the glass wafer for each of the portions that become, which the light-receiving elements, after third step. Accordingly, a plurality of the light-receiving devices can be efficiently manufactured.

According to one aspect of the present disclosure, there is provided a method for manufacturing a light-receiving device, which is a method for manufacturing the light-receiving device described above, the method including: a fifth step of disposing the light-receiving element on the inside surface of the substrate in which the metallic film is provided on the inner surface of the through-hole, so that a package which houses the light-receiving element is formed by the glass cover and the substrate; and a sixth step of forming the solder member by disposing a solder ball, which includes the metallic ball and a solder layer covering the metallic ball, in the through-hole from the outside opening portion and melting the solder layer after the fifth step.

According to the method for manufacturing the light-receiving device, the through-hole can be reliably sealed while suppressing the infiltration of the molten solder layer into the package.

In the method for manufacturing a light-receiving device according to one aspect of the present disclosure, in the sixth step, the solder layer may be melted by irradiating the solder ball with laser light. Accordingly, the solder layer can be locally heated, so that thermal influence on the light-receiving device and the like can be suppressed.

In the method for manufacturing a light-receiving device according to one aspect of the present disclosure, in the sixth step, the solder layer may be melted while an inside of the package is degassed through the through-hole. Accordingly, the inside of the package can be reliably degassed through the through-hole while suppressing the infiltration of the molten solder layer into the package.

Advantageous Effects of Invention

According to the present disclosure, it is possible to provide the light-receiving device that can accurately receive the laser light for distance measurement and can be made thin, and the method for manufacturing such a light-receiving device.

DESCRIPTION OF EMBODIMENTS

Figure 1:
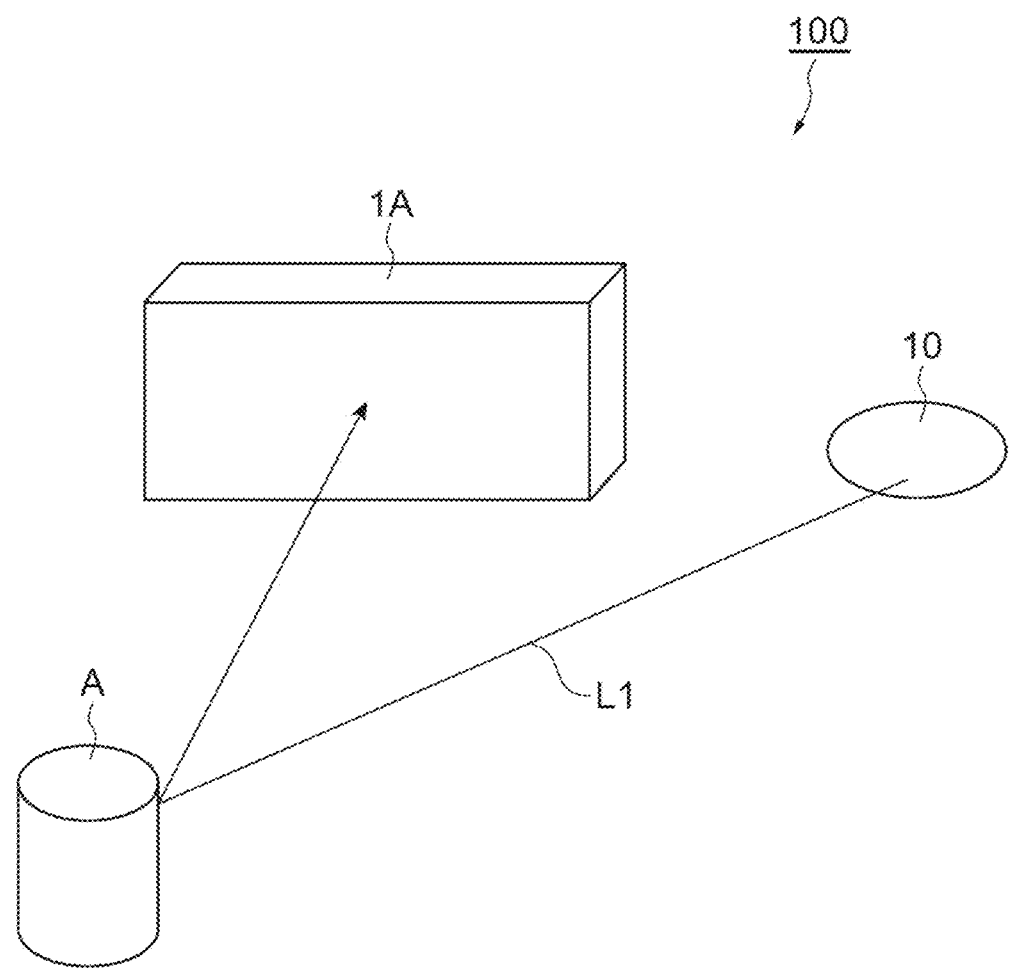
FIG. 1 is a configuration view of a distance measurement system including a light-receiving device of a first embodiment.

Hereinafter, embodiments of the present disclosure will be described in detail with reference to the drawings. Incidentally, in the drawings, the same or equivalent portions are denoted by the same reference signs, and duplicated portions will be omitted.

First Embodiment

As illustrated in FIG. 1, a distance measurement system 100 includes a light source 10 and a light-receiving device 1A. The light source 10 emits laser light L1 for distance measurement toward an object A. The light source 10 is formed of, for example, a light-emitting element such as a light-emitting diode or a semiconductor laser. The light-receiving device 1A receives the laser light L1 for distance measurement that is emitted from the light source 10 and is reflected by the object A. The distance measurement system 100 is a light detection and ranging (LiDAR) system that measures the distance to the object A using a time of flight (TOF) method.

Figure 2:
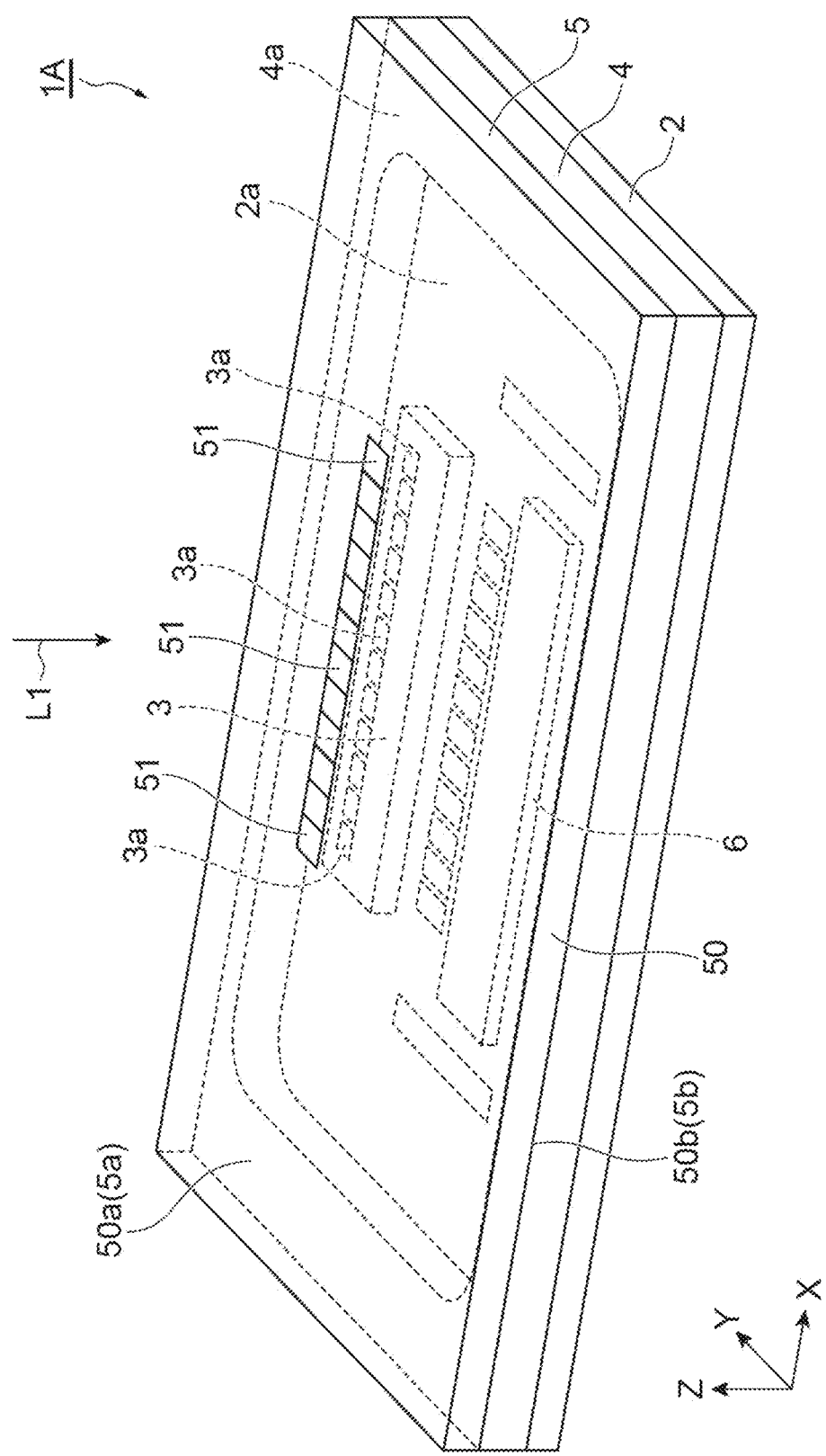
FIG. 2 is a perspective view of the light-receiving device illustrated in FIG. 1.

As illustrated in FIG. 2, the light-receiving device 1A includes a printed wiring substrate 2, a light-receiving element 3, a frame 4, and a glass cover 5. In the following description, a direction in which the laser light L1 for distance measurement is incident on the light-receiving device 1A is referred to as a Z-axis direction, one direction perpendicular to the Z-axis direction is referred to as an X-axis direction, and a direction perpendicular to the Z-axis direction and the X-axis direction is referred to as a Y-axis direction. Incidentally, in the distance measurement system 100, since the distance from the light-receiving device 1A to the object A is much larger than the size of the light-receiving device 1A, it can be considered the laser light L1 for distance measurement is incident on the light-receiving device 1A in parallel with the Z-axis direction.

The printed wiring substrate 2 is formed in, for example, a rectangular plate shape. As one example, the length of the printed wiring substrate 2 in the X-axis direction is approximately 20 mm, the length of the printed wiring substrate 2 in the Y-axis direction is approximately 10 mm, and the thickness of the printed wiring substrate 2 is approximately 1 mm.

The light-receiving element 3 is mounted on an inside surface 2a on a light-incident side (side on which the laser light L1 for distance measurement is incident) of the printed wiring substrate 2. The light-receiving element 3 is provided with a plurality of light-receiving portions 3a. In the present embodiment, the light-receiving element 3 is a surface incidence type linear sensor including the plurality of light-receiving portions 3a that are arranged in one dimension along the X-axis direction. Each of the light-receiving portions 3a is formed of, for example, an avalanche photo-diode, and functions as a pixel. Each of the light-receiving portions 3a is formed in, for example, a rectangular shape. As one example, the length of each of the light-receiving portions 3a in the X-axis direction is 0.45 mm, the length of each of the light-receiving portions 3a in the Y-axis direction is 0.46 mm, and the center-to-center distance (pitch) of the adjacent light-receiving portions 3a is 0.55 mm Incidentally, an electronic component 6 such as an application specific integrated circuit (ASIC) is also mounted on the inside surface 2a of the printed wiring substrate 2.

The frame 4 is fixed to the inside surface 2a of the printed wiring substrate 2 in a state where the frame 4 surrounds the light-receiving element 3 and the electronic component 6 when viewed in the Z-axis direction. The frame 4 is fixed to the inside surface 2a of the printed wiring substrate 2 by, for example, a resin sheet. The frame 4 is a frame-shaped support member extending along an outer edge of the printed wiring substrate 2. The height of a surface 4a on the light-incident side of the frame 4 (distance from the inside surface 2a of the printed wiring substrate 2) is larger than the height of the light-receiving element 3 and the height of the electronic component 6. For example, the frame 4 is formed in a rectangular frame shape from a glass epoxy material. As one example, the length of the frame 4 in the X-axis direction is approximately 20 mm, the length of the frame 4 in the Y-axis direction is approximately 10 mm, and the thickness of the frame 4 is approximately 1 mm.

The glass cover 5 is formed of a glass substrate 50. The glass substrate 50 is formed in, for example, a rectangular plate shape from a glass material having transmission properties for the laser light L1 for distance measurement. As one example, the length of the glass substrate 50 in the X-axis direction is approximately 20 mm, the length of the glass substrate 50 in the Y-axis direction is approximately 10 mm, and the thickness of the glass substrate 50 is approximately 0.5 mm.

The glass cover 5 has a first surface 5a and a second surface 5b. The first surface 5a is a surface on the light-incident side of the glass cover 5. The second surface 5b is a surface on an opposite side of the glass cover 5 from the first surface 5a. In the present embodiment, the first surface 5a is a surface 50a on the light-incident side of the glass substrate 50. The second surface 5b is a surface 50b on an opposite side of the glass substrate 50 from the first surface 5a.

The glass cover 5 is fixed above the light-receiving element 3 such that the second surface 5b faces the light-receiving element 3. The glass cover 5 is fixed above the light-receiving element 3 in a state where the glass cover 5 is separated from the light-receiving element 3. More specifically, the second surface 5b of the glass cover 5 is fixed to the surface 4a of the frame 4 in a state where the glass cover 5 closes an opening on the light-incident side of the frame 4, so that the glass cover 5 is fixed above the light-receiving element 3. The glass cover 5 is fixed to the surface 4a of the frame 4 by, for example, a resin-based adhesive. As one example, a gap of, for example, approximately 0.5 mm is provided between the light-receiving element 3 and the glass cover 5.

In the light-receiving device 1A, the printed wiring substrate 2, the frame 4, and the glass cover 5 form a package that houses the light-receiving element 3 and the electronic component 6. The package defines a space in which the light-receiving element 3 and the electronic component 6 are disposed.

The glass cover 5 includes a plurality of diffraction gratings 51. The plurality of diffraction gratings 51 are provided in the first surface 5a of the glass cover 5. In the present embodiment, the plurality of diffraction gratings 51 are formed in the surface 50a of the glass substrate 50. The plurality of diffraction gratings 51 correspond one-to-one to the plurality of light-receiving portions 3a. The diffraction grating 51 and the light-receiving portion 3a corresponding to each other at least partially overlap each other when viewed in the Z-axis direction. Each of the diffraction gratings 51 is configured to concentrate the laser light L1 for distance measurement (in the present embodiment, the laser light L1 for distance measurement that is emitted from the light source 10 and is reflected by the object A) on each of the light-receiving portions 3a, the laser light L1 incident on the first surface 5a of the glass cover 5 in parallel with the Z-axis direction. Namely, each of the diffraction gratings 51 is configured to concentrate light, which has a wavelength corresponding to the wavelength of the laser light L1 for distance measurement, on each of the light-receiving portions 3a.

Figure 3:
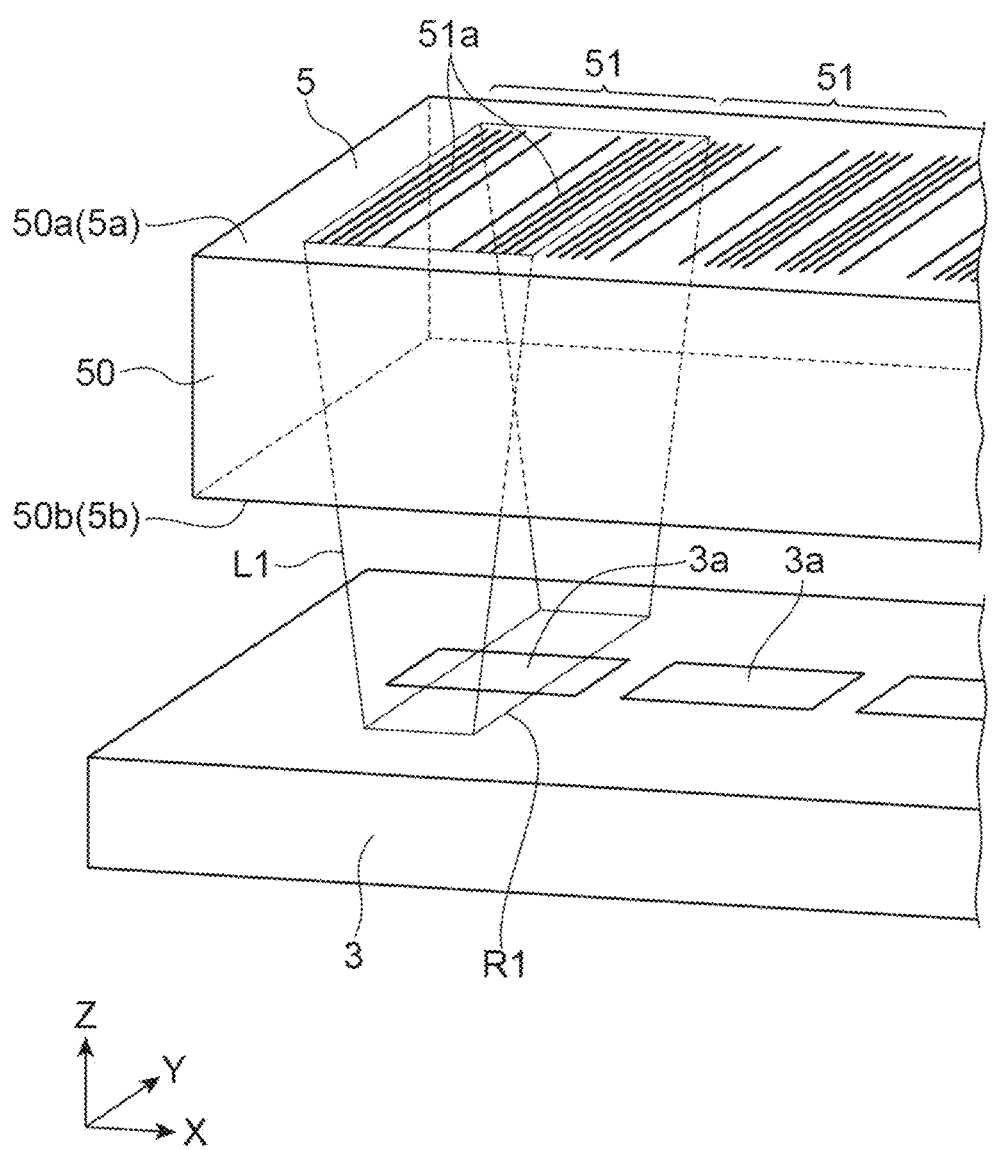
FIG. 3 is an enlarged view of the light-receiving device illustrated in FIG. 2.

As illustrated in FIG. 3, the diffraction grating 51 is formed in, for example, a rectangular shape. In the present embodiment, the diffraction grating 51 is formed of a plurality of refractive index change areas 51a, in which the refractive index is changed from that of a surrounding area, on the surface 50a of the glass substrate 50. The transmittance of the laser light L1 for distance measurement in the refractive index change areas 51a is lower than the transmittance of the laser light L1 for distance measurement in an area other than the refractive index change areas 51a on the surface 50a of the glass substrate 50. As one example, each of the refractive index change areas 51a extends along the Y-axis direction, and the distance between the adjacent refractive index change areas 51a decreases from the center toward both sides in the X-axis direction. Accordingly, the diffraction grating 51 concentrates the laser light L1 for distance measurement, which has been incident in parallel with the Z-axis direction, only in a plane perpendicular to the Y-axis direction. Therefore, the laser light L1 for distance measurement that has been concentrated by the diffraction grating 51 has an irradiation area R1, which has the Y-axis direction as a longitudinal direction, on the corresponding light-receiving portion 3a. As one example, the width of the irradiation area R1 in the X-axis direction is smaller than the width of the light-receiving portion 3a in the X-axis direction, and the width of the irradiation area R1 in the Y-axis direction is larger than the width of the light-receiving portion 3a in the Y-axis direction.

As described above, in the light-receiving device 1A, the glass cover 5 includes the plurality of diffraction gratings 51, and each of the diffraction gratings 51 is configured to concentrate the laser light L1 for distance measurement on each of the light-receiving portions 3a, the laser light L1 for distance measurement incident on the glass cover 5. Accordingly, a reduction in crosstalk between the adjacent light-receiving portions 3a and an improvement in sensitivity of each of the light-receiving portions 3a can be achieved. Moreover, the plurality of diffraction gratings 51 are provided in the first surface 5a of the glass cover 5. Accordingly, it is not necessary to provide, as a separate member, a light-concentrating element between the light-receiving element 3 and the glass cover 5. In addition, since the distance from the light-receiving element 3 to the plurality of diffraction gratings 51 is larger than that when the plurality of diffraction gratings 51 are provided in the second surface 5b of the glass cover 5, the glass cover 5 can be fixed above the light-receiving element 3 in a state where the glass cover 5 is placed closer to the light-receiving element 3. As a result, the light-receiving device 1A can accurately receive the laser light L1 for distance measurement, and can be made thin (made thin in the Z-axis direction).

Particularly, in the light-receiving device 1A, since it can be considered that the laser light L1 for distance measurement is incident on the first surface 5a of the glass cover 5 in parallel with the Z-axis direction, the plurality of diffraction gratings 51 having the same pattern as each other can be adopted as a plurality of light-concentrating elements. Namely, in the light-receiving device 1A, since light having a wavelength corresponding to the wavelength of the laser light L1 for distance measurement and incident on the first surface 5a of the glass cover 5 in parallel with the Z-axis direction can be effectively concentrated on each of the light-receiving portions 3a, the plurality of diffraction gratings 51 having the same pattern as each other can be easily and accurately formed.

Incidentally, the light-receiving device 1A may be used under an environment in which a change in temperature is large, such as a case in which the distance measurement system 100 is used for in-vehicle applications. In such a case, it is very effective to provide, as a plurality of light-concentrating elements, the plurality of diffraction gratings 51 in the glass cover 5. The reason is that the coefficient of thermal expansion of the glass material is closer to the coefficient of thermal expansion of a semiconductor material forming the light-receiving element 3 than a resin material, and the glass material has higher environmental resistance than the resin material. Since the plurality of diffraction gratings 51 are provided, as a plurality of light-concentrating elements, in the glass cover 5, even under an environment in which a change in temperature is large, the laser light L1 for distance measurement incident on the glass cover 5 can be reliably concentrated on each of the light-receiving portions 3a.

In addition, in the light-receiving device 1A, the glass cover 5 is fixed above the light-receiving element 3 in a state where the glass cover 5 is separated from the light-receiving element 3. In addition, in the light-receiving device 1A, the plurality of diffraction gratings 51 are formed in the surface 50a of the glass substrate 50 forming the glass cover 5. Accordingly, the distance from the light-receiving element 3 to the plurality of diffraction gratings 51 can be set to an appropriate distance, and the laser light L1 for distance measurement incident on the glass cover 5 can be reliably concentrated on each of the light-receiving portions 3a.

Figure 4:
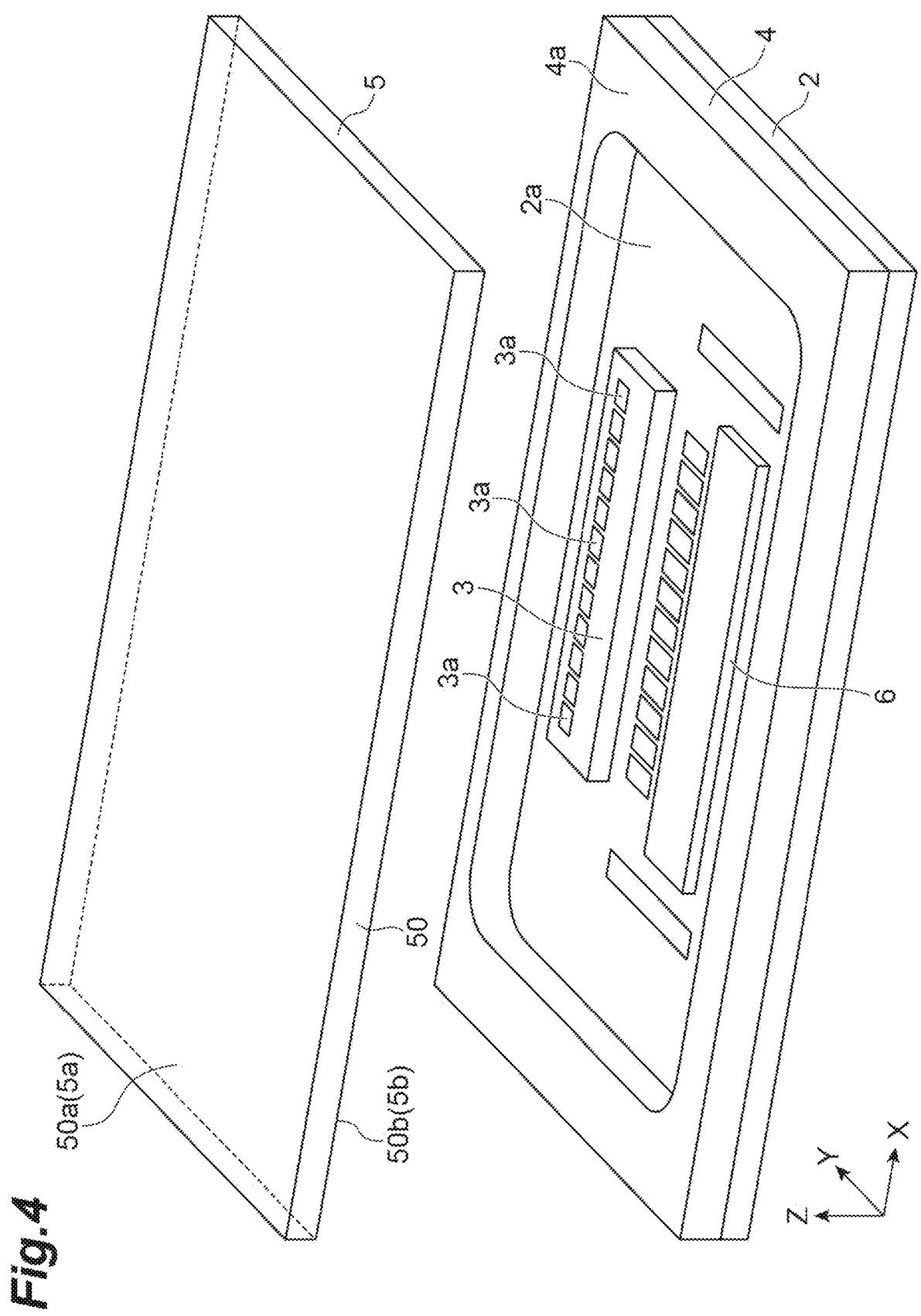
FIG. 4 is a view illustrating one step of a method for manufacturing the light-receiving device illustrated in FIG. 2.
Figure 5:
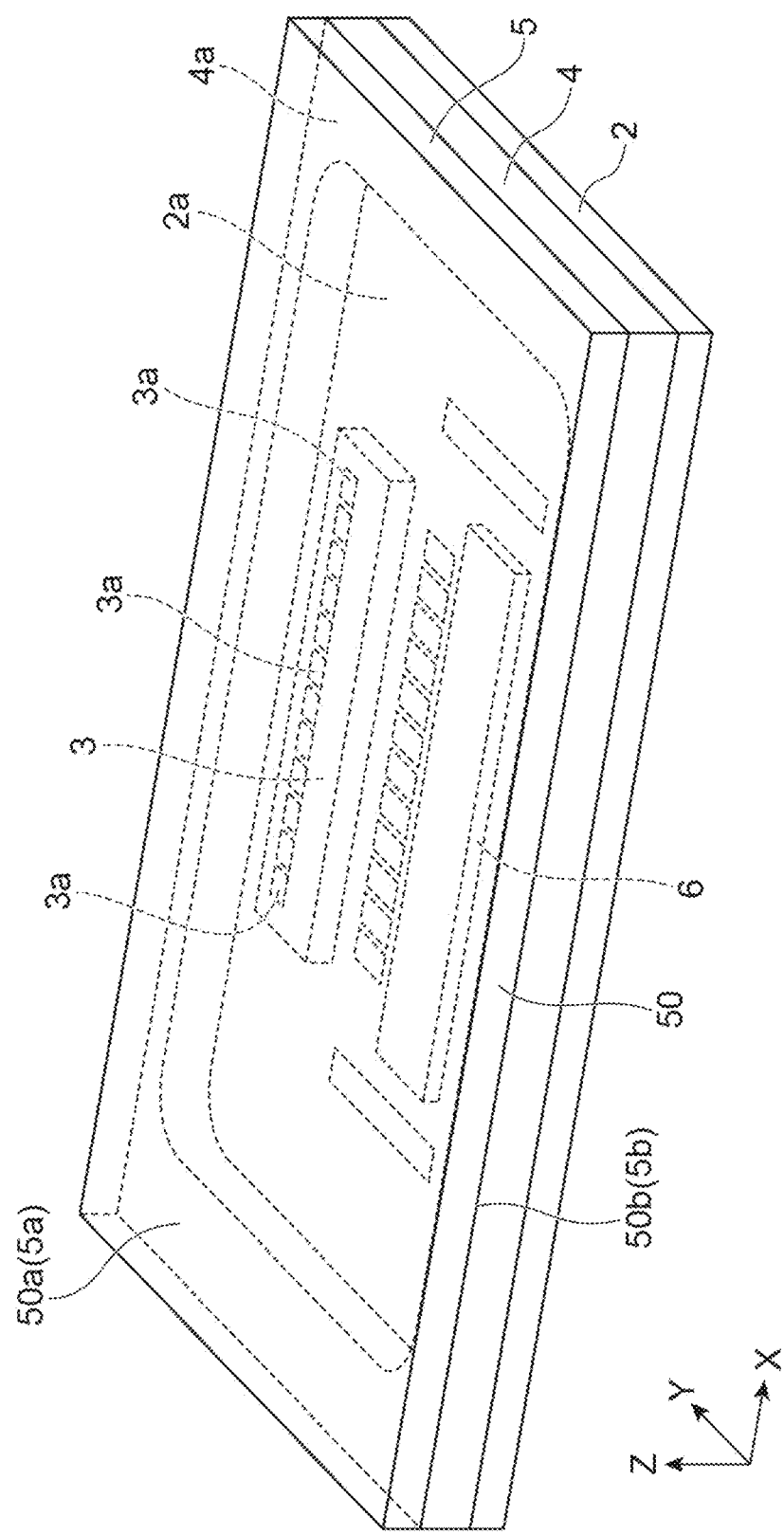
FIG. 5 is a view illustrating one step of the method for manufacturing the light-receiving device illustrated in FIG. 2.

Next, a method for manufacturing the light-receiving device 1A will be described. First, as illustrated in FIG. 4, the light-receiving element 3 is prepared in a state where the light-receiving element 3 and the electronic component 6 are mounted on the printed wiring substrate 2 and the frame 4 is fixed to the printed wiring substrate 2 (first step). Meanwhile, the glass cover 5 is prepared (first step). Subsequently, as illustrated in FIG. 5, the frame 4 is fixed to the glass cover 5. Therefore, the glass cover 5 is fixed above the light-receiving element 3 such that the glass cover 5 is separated from the light-receiving element 3 (second step).

Figure 6:
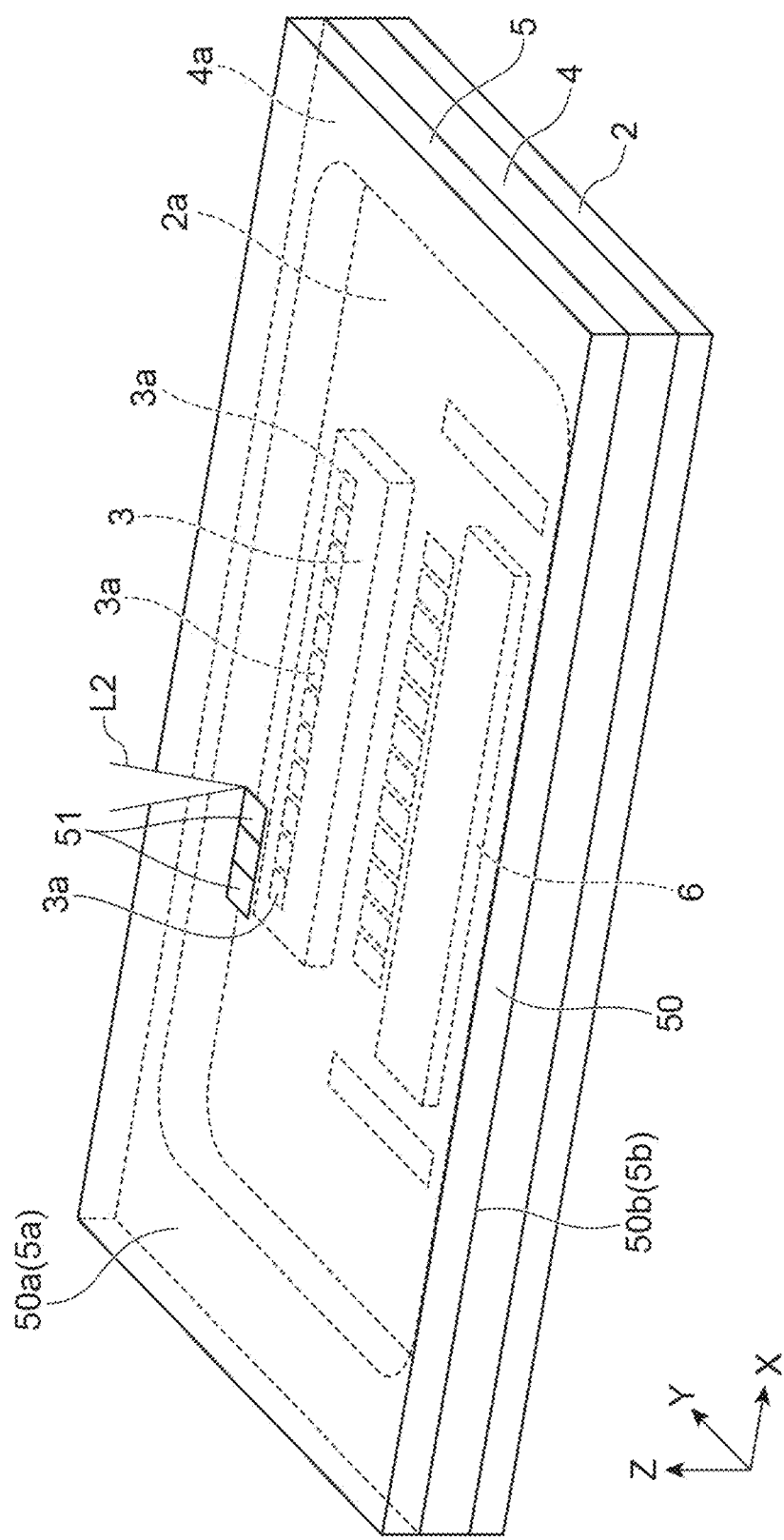
FIG. 6 is a view illustrating one step of the method for manufacturing the light-receiving device illustrated in FIG. 2.

Subsequently, as illustrated in FIG. 6, the plurality of diffraction gratings 51 are formed in the glass cover 5 by irradiating the glass cover 5 with laser light L2 for processing (third step). In the present embodiment, the plurality of diffraction gratings 51 are formed in the surface 50a of the glass substrate 50 such that each of the diffraction gratings 51 concentrates the laser light L1 for distance measurement on each of the light-receiving portions 3a, the laser light L1 for distance measurement incident on the glass cover 5. The surface 50a of the glass substrate 50 is irradiated with the laser light L2 for processing from a side opposite to the light-receiving element 3 along the Z-axis direction in a state where a concentration point is placed on the surface 50a of the glass substrate 50. The concentration point of the laser light L2 for processing is scanned on the surface 50a of the glass substrate 50, for example, with reference to the light-receiving portion 3a. The laser light L2 for processing is, for example, femtosecond laser light. The light-receiving device 1A is obtained from the above steps.

As described above, in the method for manufacturing the light-receiving device 1A, the plurality of diffraction gratings 51 are formed in the glass cover 5 by fixing the glass cover 5 above the light-receiving element 3 and then irradiating the glass cover 5 with the laser light L2 for processing. Accordingly, the light-receiving device 1A in which the diffraction gratings 51 are accurately positioned with respect to the respective light-receiving portions 3a can be efficiently obtained. As a result, according to the method for manufacturing the light-receiving device 1A, the light-receiving device 1A can be appropriately manufactured.

In addition, in the method for manufacturing the light-receiving device 1A, the glass cover 5 is fixed above the light-receiving element 3 such that the glass cover 5 is separated from the light-receiving element 3. Accordingly, in the manufactured light-receiving device 1A, the distance from the light-receiving element 3 to the plurality of diffraction gratings 51 can be set to an appropriate distance, and the laser light L1 for distance measurement incident on the glass cover 5 can be reliably concentrated on each of the light-receiving portions 3a.

In addition, in the method for manufacturing the light-receiving device 1A, the plurality of diffraction gratings 51 are formed in the surface 50a of the glass substrate 50. Accordingly, the influence of the irradiation of the laser light L2 for processing on the light-receiving element 3 can be suppressed.

In addition, in the method for manufacturing the light-receiving device 1A, the plurality of diffraction gratings 51 are formed as a plurality of light-concentrating elements. Accordingly, the plurality of light-concentrating elements can be easily provided in the glass cover 5 by the irradiation of the laser light L2 for processing.

Second Embodiment

Figure 7:
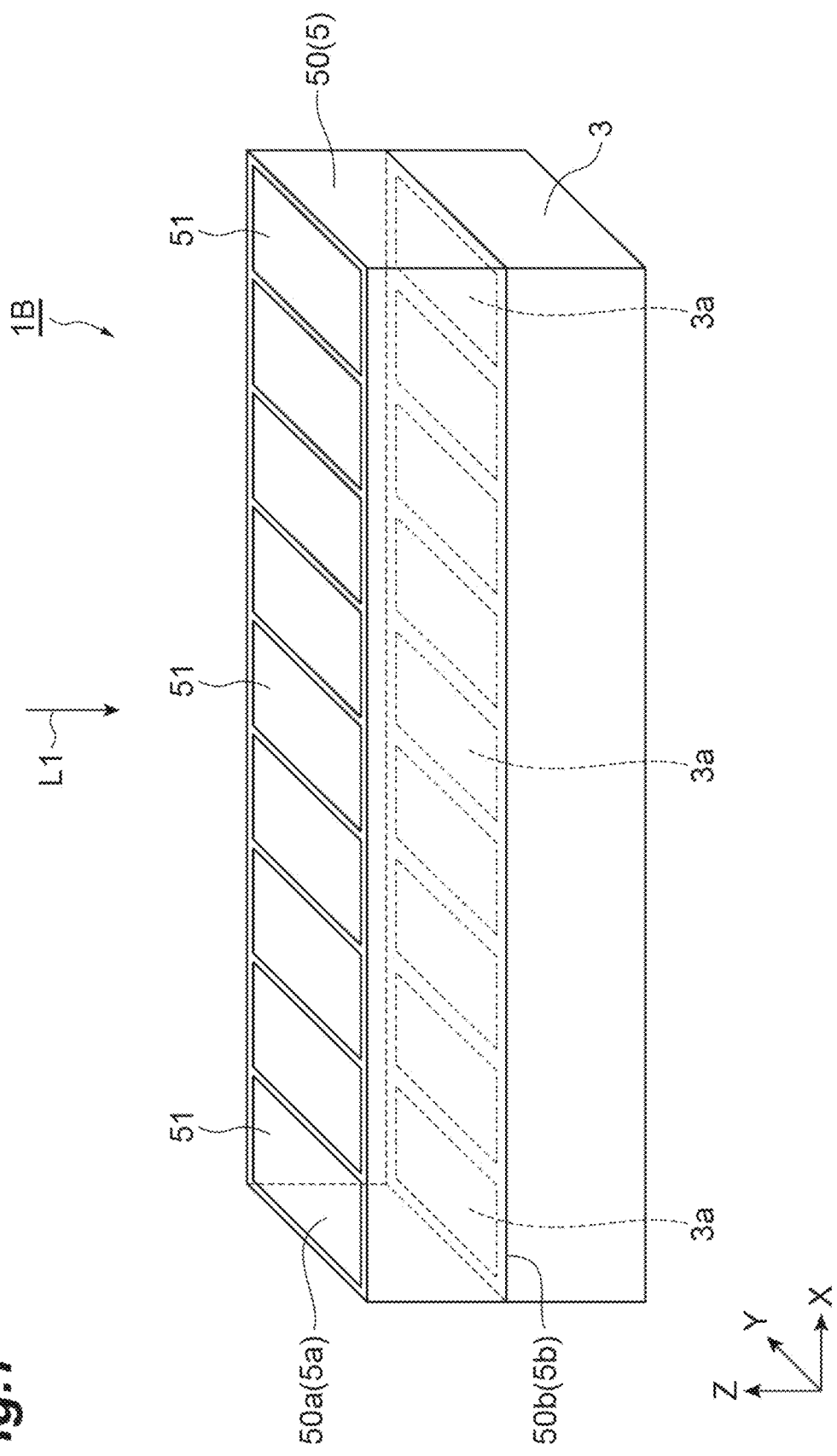
FIG. 7 is a perspective view of a light-receiving device of a second embodiment.

As illustrated in FIG. 7, a light-receiving device 1B mainly differs from the light-receiving device 1A described above in that the glass cover 5 is fixed on the light-receiving element 3 in a state where the glass cover 5 is in contact with the light-receiving element 3. In the light-receiving device 1B, the glass cover 5 is fixed on the light-receiving element 3 by, for example, a resin having transmission properties or a resin sheet (adhesive layer) having a film structure. In the present embodiment, when viewed in the Z-axis direction, the glass cover 5 is formed in a long shape in which an outer edge of the glass cover 5 is aligned with an outer edge of the light-receiving element 3. Also in the light-receiving device 1B, the plurality of diffraction gratings 51 are provided in the first surface 5a of the glass cover 5, and each of the diffraction gratings 51 is configured to concentrate the laser light L1 for distance measurement on each of the light-receiving portions 3a, the laser light L1 for distance measurement incident on the first surface 5a of the glass cover 5 in parallel with the Z-axis direction. Incidentally, a configuration in which only an adhesive layer exists between the light-receiving element 3 and the glass cover 5 corresponds to a configuration in which the glass cover 5 is fixed on the light-receiving element 3 in a state where the glass cover 5 is in contact with the light-receiving element 3.

The light-receiving device 1B described above can be made thinner (made thin in the Z-axis direction) in addition to exhibiting the same effects as those of the light-receiving device 1A described above. Particularly, in the light-receiving device 1B, since the glass cover 5 is fixed on the light-receiving element 3 in a state where the glass cover 5 is in contact with the light-receiving element 3, the distance from the light-receiving element 3 to the plurality of diffraction gratings 51 can be more accurately defined than, for example, when the glass cover 5 is fixed above the light-receiving element 3 with another member interposed therebetween. Incidentally, in the configuration in which the glass cover 5 is fixed on the light-receiving element 3 in a state where the glass cover 5 is in contact with the light-receiving element 3, it is more important that a cover including the plurality of diffraction gratings 51 forms the glass substrate 50. The reason is that generally, the coefficient of thermal expansion of glass is closer to the coefficient of thermal expansion of the semiconductor material forming the light-receiving element 3 than the coefficient of thermal expansion of the resin, and even in an environment in which a change in temperature is large (for example, an interior or the like of an automobile), misalignment between the diffraction grating 51 and the light-receiving portion 3a corresponding to each other is unlikely to occur.

Figure 8:
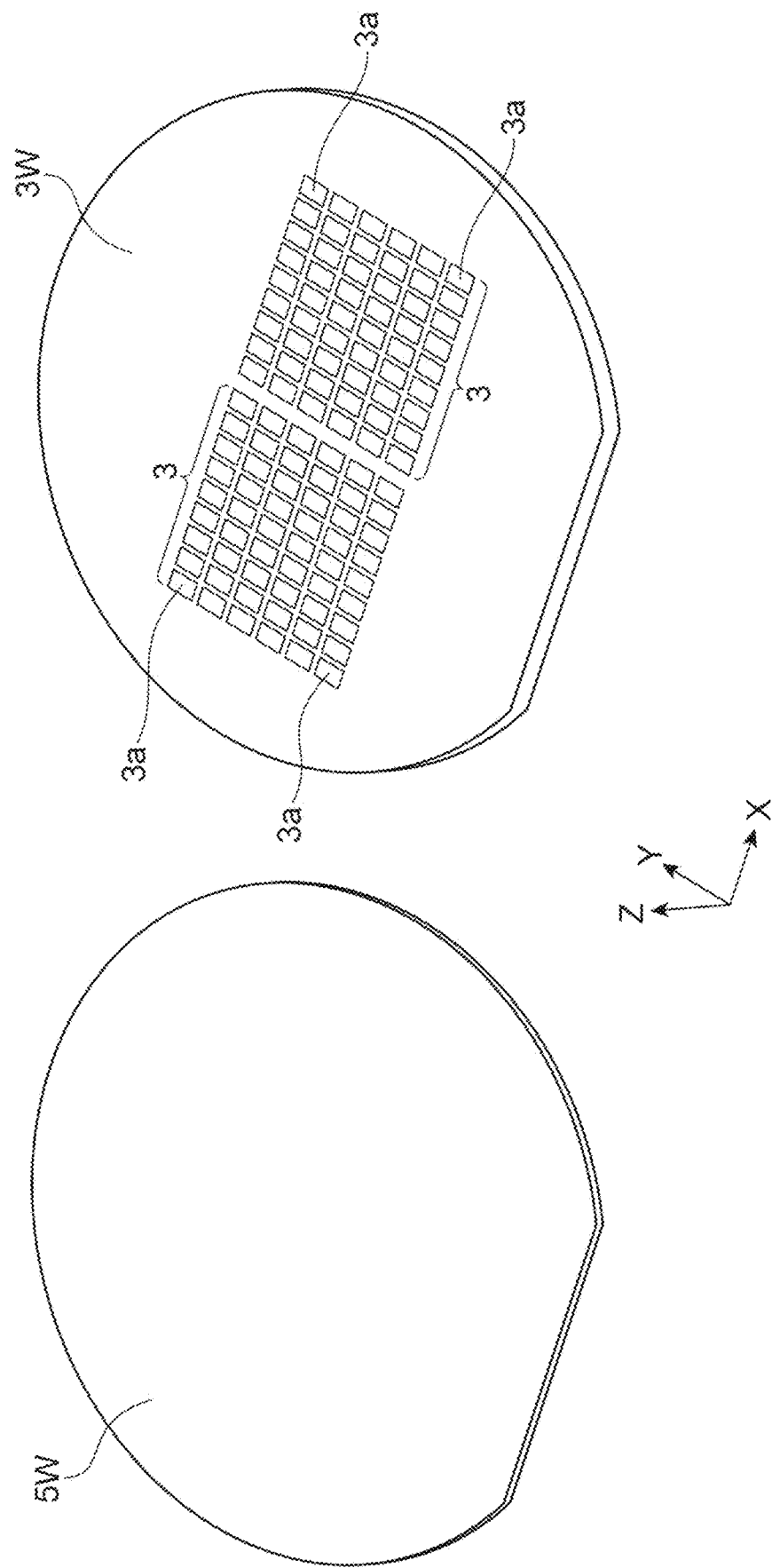
FIG. 8 is a view illustrating one step of a method for manufacturing the light-receiving device illustrated in FIG. 7.
Figure 9:
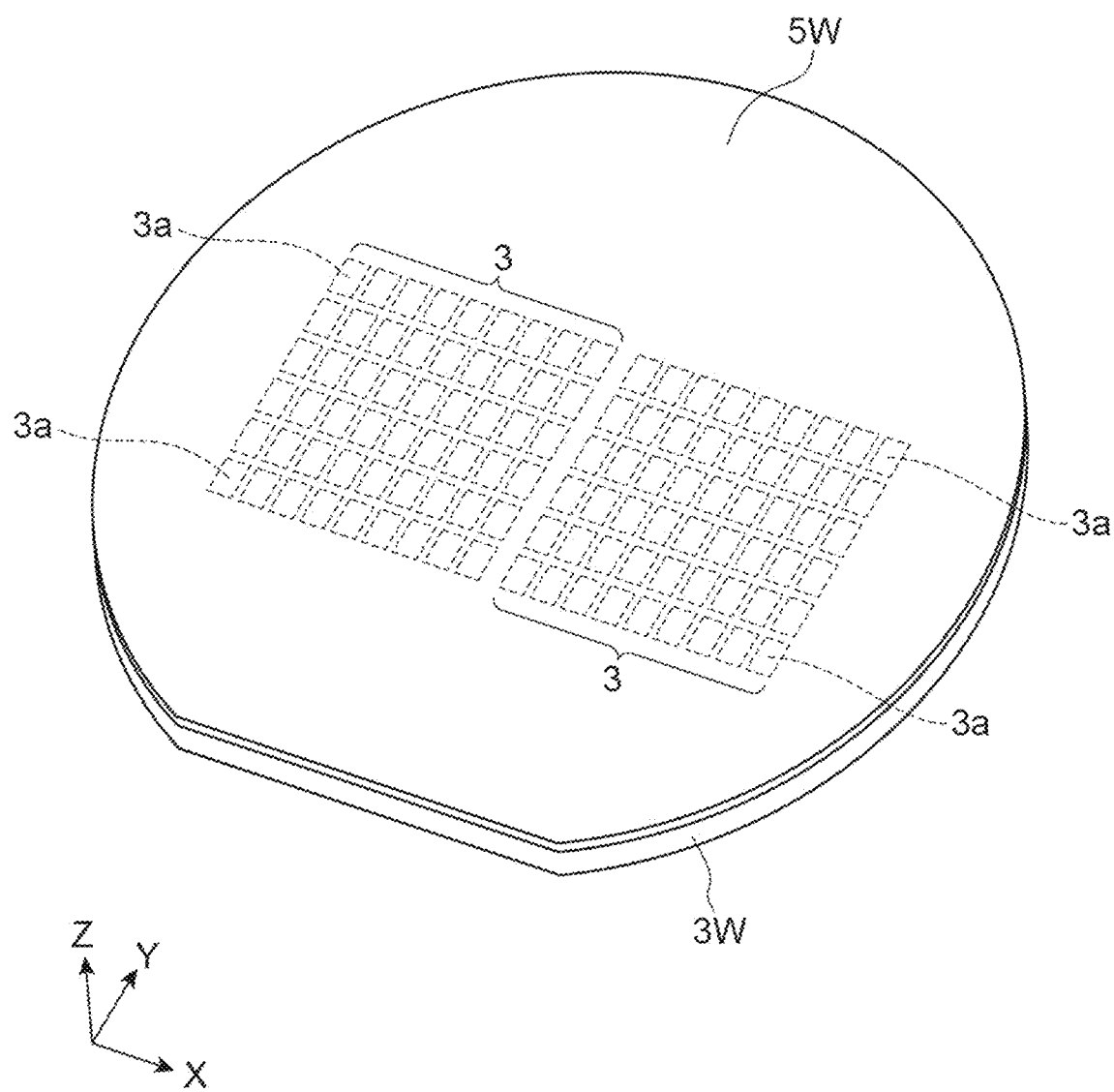
FIG. 9 is a view illustrating one step of the method for manufacturing the light-receiving device illustrated in FIG. 7.

Next, a method for manufacturing the light-receiving device 1B will be described. First, as illustrated in FIG. 8, a semiconductor wafer 3W including a plurality of portions that become the light-receiving elements 3, and a glass wafer 5W including a plurality of portions (not illustrated) that become the glass covers 5 are prepared (first step). In the semiconductor wafer 3W, the plurality of portions that become a plurality of the light-receiving elements 3 are arranged in two dimensions. The glass wafer 5W is sized to cover the plurality of portions which become the plurality of light-receiving elements 3. Subsequently, as illustrated in FIG. 9, for example, the glass wafer 5W is fixed on the semiconductor wafer 3W by, for example, a resin having transmission properties or a resin sheet having a film structure (second step). This step corresponds to fixing the glass cover 5 on the light-receiving element 3 such that the glass cover 5 is in contact with the light-receiving element 3.

Figure 10:
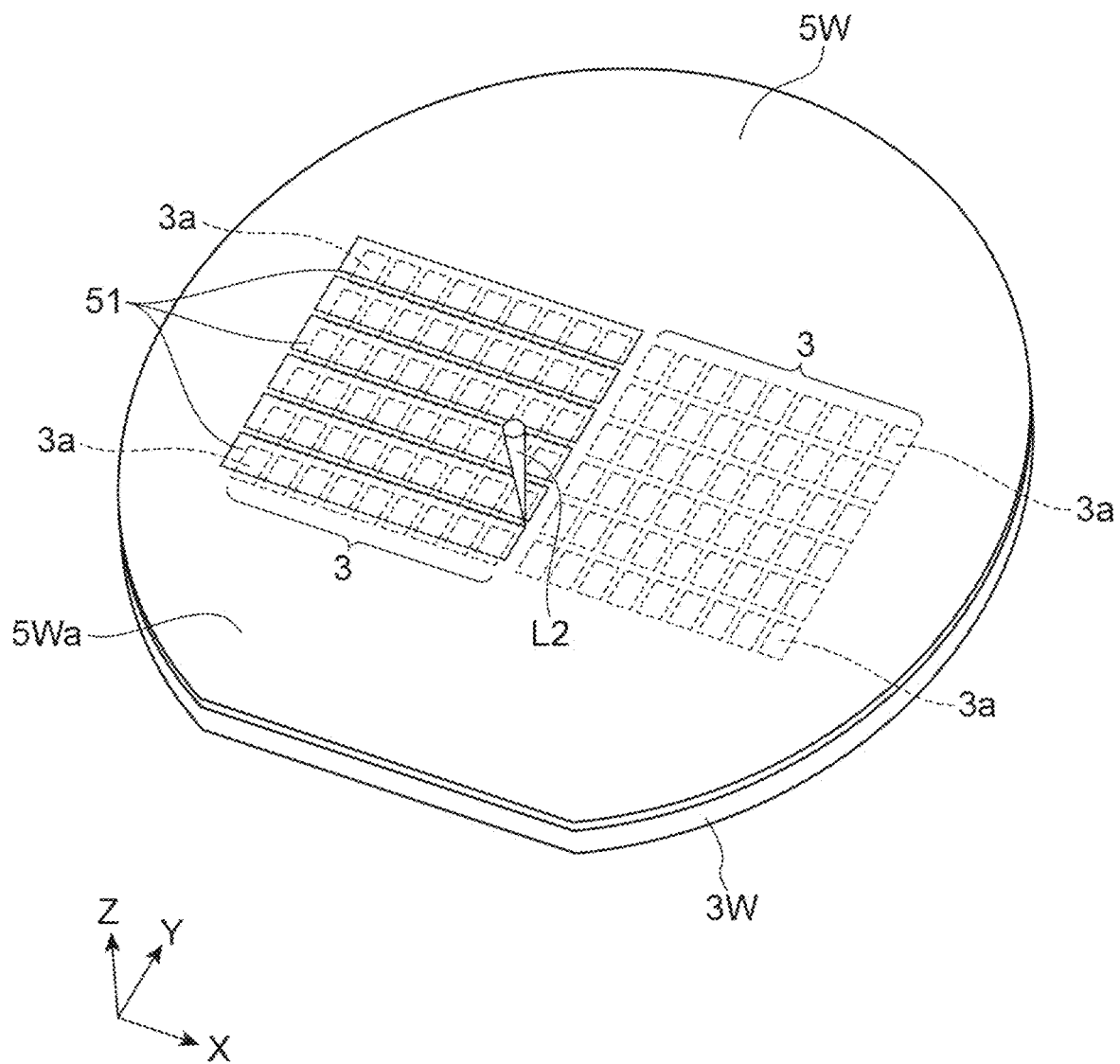
FIG. 10 is a view illustrating one step of the method for manufacturing the light-receiving device illustrated in FIG. 7.
Figure 11:
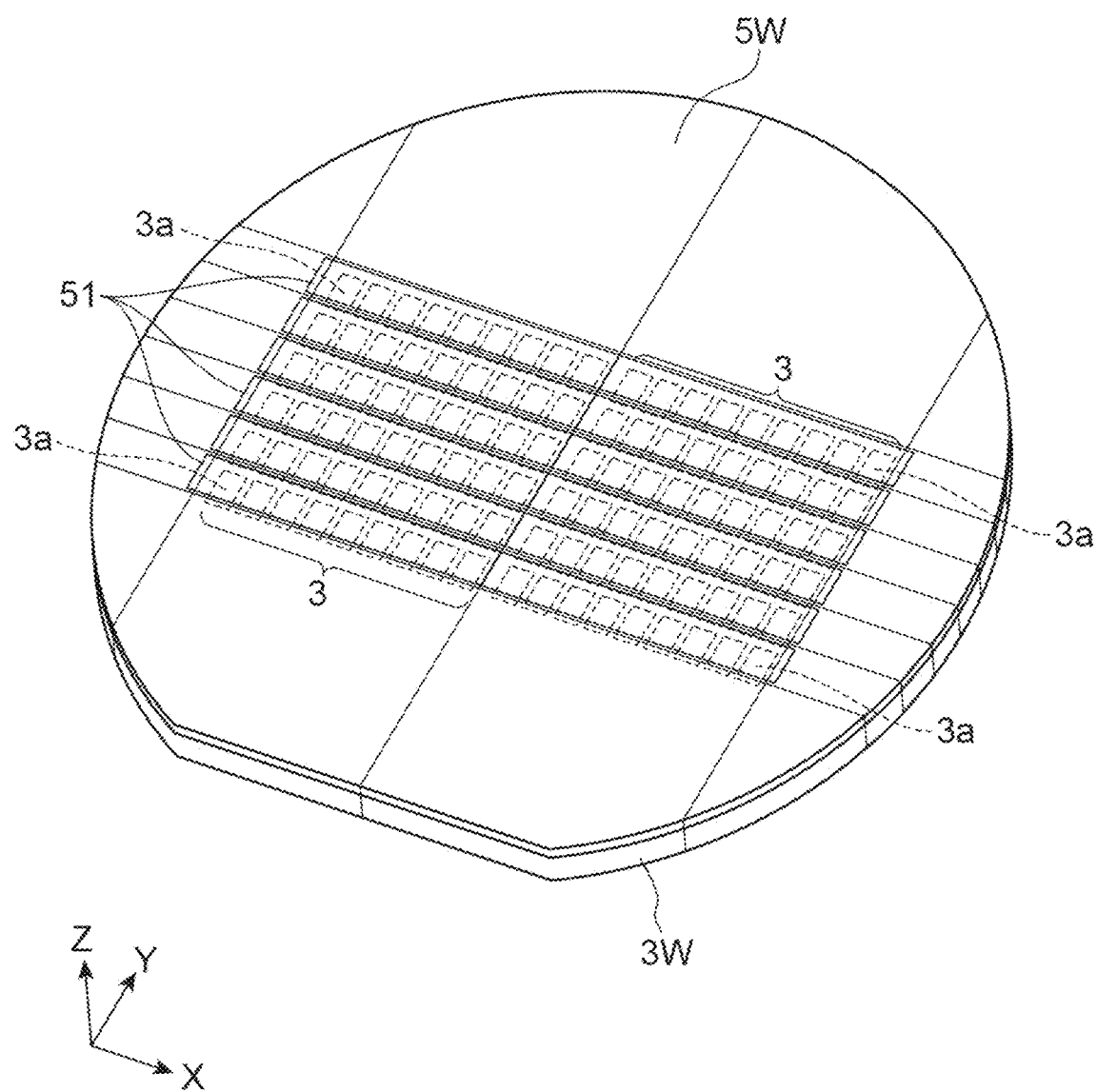
FIG. 11 is a view illustrating one step of the method for manufacturing the light-receiving device illustrated in FIG. 7.

Subsequently, as illustrated in FIG. 10, the plurality of diffraction gratings 51 are formed for each of the portions, which becomes the light-receiving element 3, by irradiating the glass wafer 5W with the laser light L2 for processing (third step). In the present embodiment, the plurality of diffraction gratings 51 are formed in a surface 5Wa of the glass wafer 5W such that each of the diffraction gratings 51 concentrates the laser light L1 for distance measurement on each of the light-receiving portions 3a, the laser light L1 for distance measurement incident on the glass cover 5. This step corresponds to forming the plurality of diffraction gratings 51 in the surface 50a of the glass substrate 50. The surface 5Wa is a surface on an opposite side of the glass wafer 5W from the semiconductor wafer 3W. The surface 5Wa of the glass wafer 5W is irradiated with the laser light L2 for processing from a side opposite to the semiconductor wafer 2W along the Z-axis direction in a state where a concentration point is placed on the surface 5Wa of the glass wafer 5W. The concentration point of the laser light L2 for processing is scanned on the surface 5Wa of the glass wafer 5W, for example, with reference to the light-receiving portion 3a for each of the portions that become the light-receiving elements 3. The laser light L2 for processing is, for example, femtosecond laser light. Subsequently, as illustrated in FIG. 11, the semiconductor wafer 3W and the glass wafer 5W are cut for each of the portions that become the light-receiving elements 3 (fourth step). A plurality of the light-receiving devices 1B are obtained from the above steps.

According to the method for manufacturing the light-receiving device 1B described above, the following effect is exhibited in addition to exhibiting the same effects as those in the method for manufacturing the light-receiving device 1A described above. Namely, according to the method for manufacturing the light-receiving device 1B, the manufactured light-receiving device 1B can be made thinner. In addition, since the method for manufacturing the light-receiving device 1B is performed at the wafer level, the plurality of diffraction gratings 51 can be efficiently formed by the irradiation of the laser light L2 for processing, and as a result, the plurality of light-receiving devices 1B can be efficiently manufactured.

Third Embodiment

Figure 12:
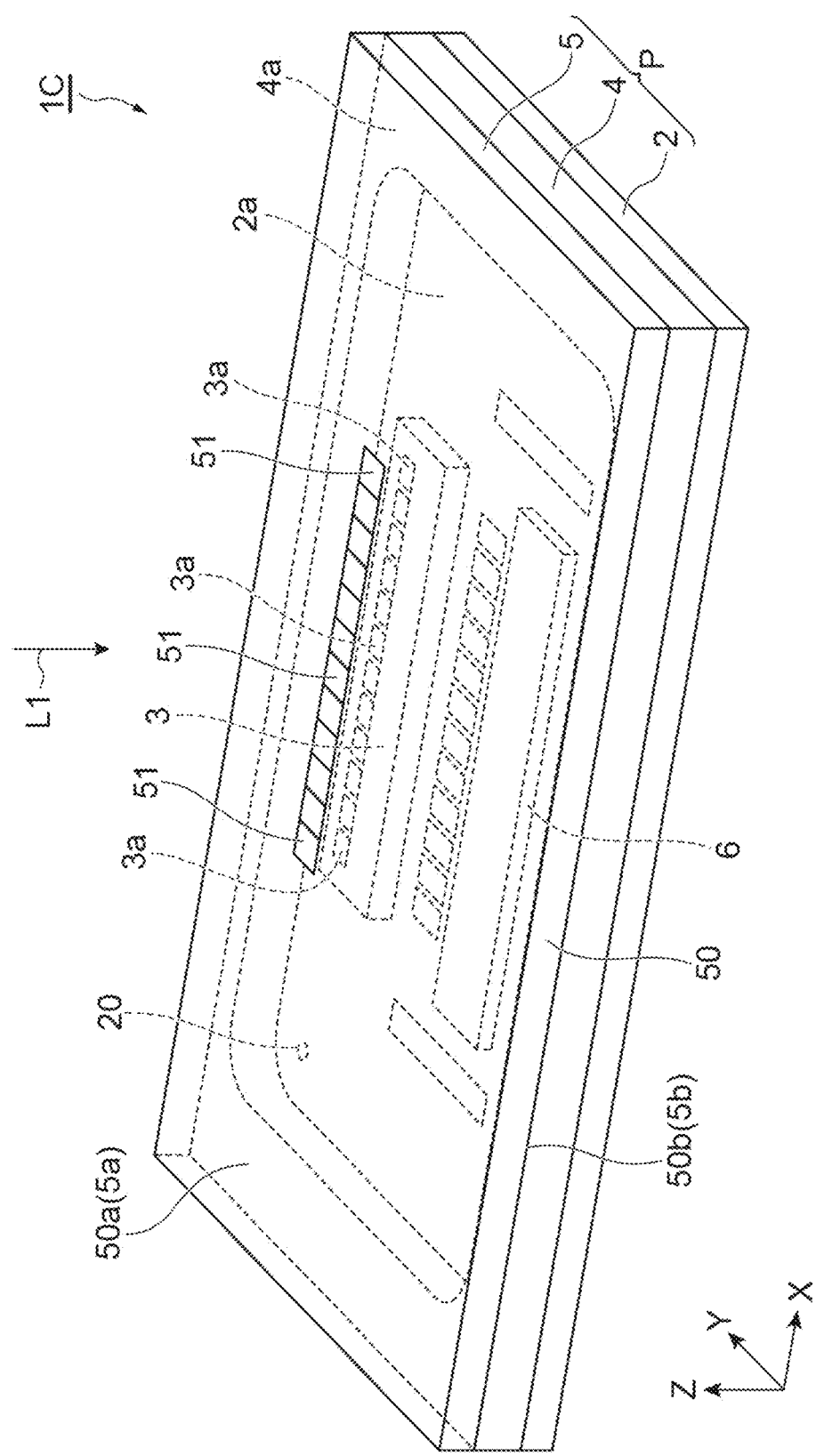
FIG. 12 is a perspective view of a light-receiving device of a third embodiment.

As illustrated in FIG. 12, a light-receiving device 1C of a third embodiment mainly differs from the light-receiving device 1A described above in that a through-hole 20 is formed in the printed wiring substrate 2. In the light-receiving device 1C, the printed wiring substrate (substrate) 2, the frame 4, and the glass cover 5 form a package P that houses the light-receiving element 3. Namely, the printed wiring substrate 2 forms, together with the glass cover 5, the package P that houses the light-receiving element 3.

Figure 13:
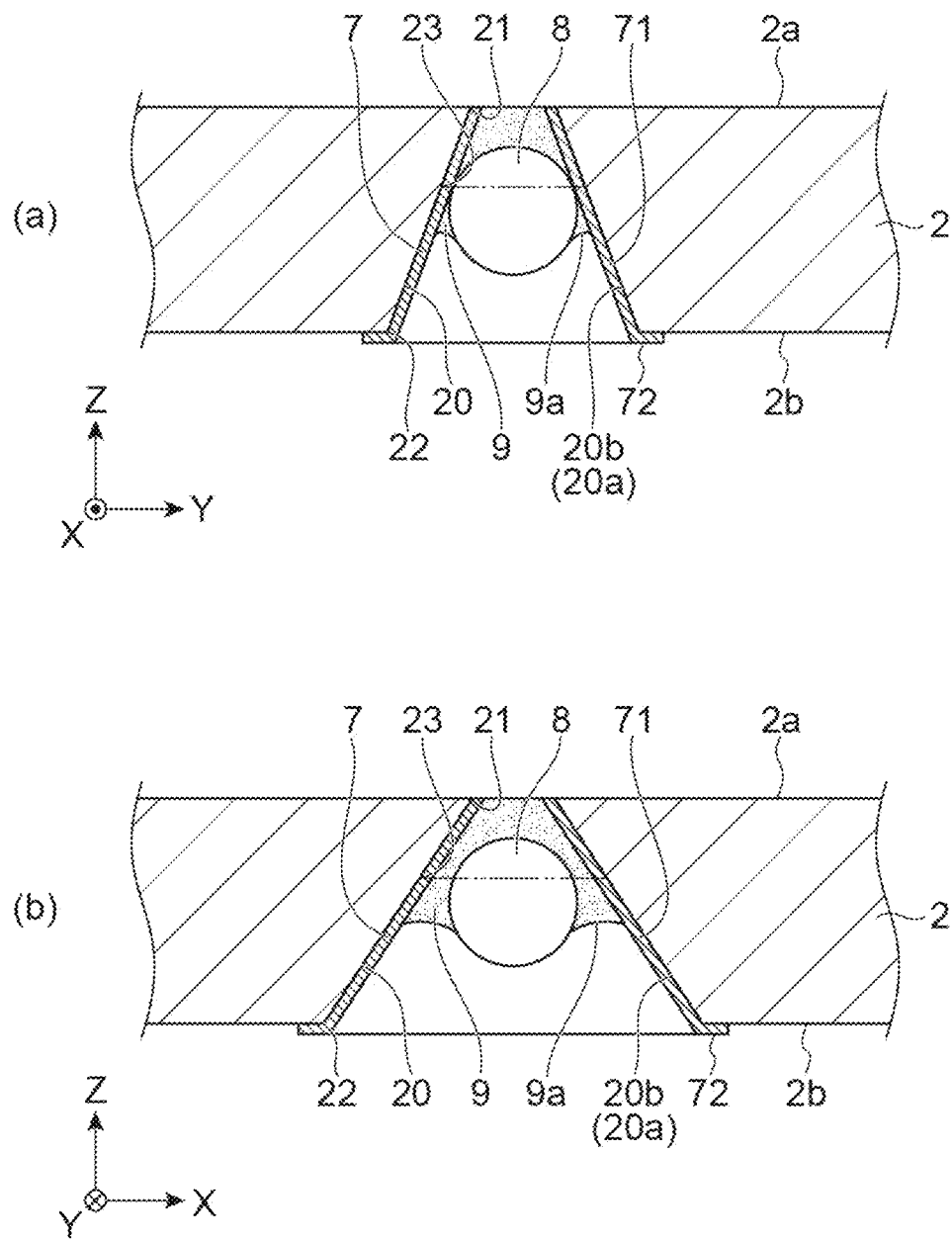
FIG. 13 provides cross-sectional views of a portion of a printed wiring substrate of the light-receiving device illustrated in FIG. 12.

FIG. 13(a) is a cross-sectional view of a portion of the printed wiring substrate 2, which includes the through-hole 20, taken in parallel with the Y-axis direction, and FIG. 13(b) is a cross-sectional view of a portion of the printed wiring substrate 2, which includes the through-hole 20, taken in parallel with the X-axis direction. As illustrated in FIGS. 13(a) and 13(b), the through-hole 20 is open to the inside surface 2a and an outside surface 2b of the printed wiring substrate 2. The inside surface 2a is a surface on which the light-receiving element 3 (refer to FIG. 12) is disposed, and the outside surface 2b is a surface opposite to the inside surface 2a. The through-hole 20 is a tapered hole that widens from the inside surface 2a toward the outside surface 2b. The through-hole 20 includes an inside opening portion 21, an outside opening portion 22, and an intermediate opening portion 23. The inside opening portion 21 is located in the inside surface 2a. The outside opening portion 22 is located in the outside surface 2b. The intermediate opening portion 23 is located between the inside surface 2a and the outside surface 2b.

Figure 14:
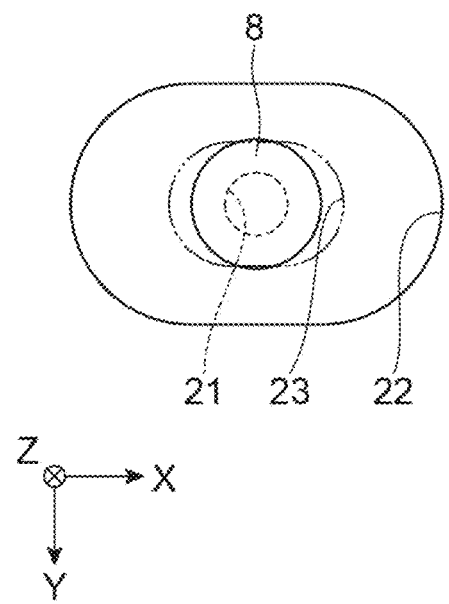
FIG. 14 is a bottom view of a portion of the printed wiring substrate illustrated in FIG. 13.

As illustrated in FIG. 14, the outside opening portion 22 has a shape through which a metallic ball 8 to be described later is passable. Namely, when viewed in the Z-axis direction, the outside opening portion 22 has a shape which can include the entirety of the metallic ball 8 at any position. The intermediate opening portion 23 has a shape through which the metallic ball 8 is not passable. Namely, when viewed in the Z-axis direction, the intermediate opening portion 23 has a shape which cannot include the entirety of the metallic ball 8 at any position. In the present embodiment, the intermediate opening portion 23 has a long shape having one direction as a longitudinal direction (namely, a shape in which the width in the one direction is larger than the width in a direction perpendicular to the one direction). When viewed in the Z-axis direction, both end portions of the intermediate opening portion 23 in the longitudinal direction do not overlap the metallic ball 8. The shape of the inside opening portion 21 is arbitrary. Incidentally, the Z-axis direction is a direction in which the inside surface 2a and the outside surface 2b face each other.

As one example, the inside opening portion 21 has a circular shape, and each of the outside opening portion 22 and the intermediate opening portion 23 has an oval shape having the X-axis direction as a longitudinal direction. When viewed in the Z-axis direction, the inside opening portion 21 is located inside the intermediate opening portion 23, and the intermediate opening portion 23 is located inside the outside opening portion 22. Incidentally, in FIG. 14, a metallic film 7 and a solder member 9 to be described later are not illustrated.

As illustrated in FIGS. 13(a) and 13(b), the metallic film 7 is provided on an inner surface 20a of the through-hole 20. The metallic film 7 includes a cylindrical portion 71 and a flange portion 72. The cylindrical portion 71 is provided on a side surface 20b of the inner surface 20a of the through-hole 20, the side surface 20b being located between the outside opening portion 22 and the intermediate opening portion 23. The flange portion 72 is provided on the outside surface 2b of the printed wiring substrate 2 to extend along an outer edge of the outside opening portion 22. The cylindrical portion 71 is connected to the flange portion 72. In the present embodiment, the metallic film 7 reaches the inside opening portion 21. The metallic film 7 is formed, for example, by Cu or Au plating.

The metallic ball 8 is disposed in the through-hole 20. The metallic ball 8 is disposed in the through-hole 20 to be surrounded by the cylindrical portion 71 of the metallic film 7. More specifically, a portion on an outside opening portion 22 side of the metallic ball 8 is surrounded by the cylindrical portion 71 of the metallic film 7. The metallic ball 8 has a spherical shape. The center of the metallic ball 8 is located between the outside opening portion 22 and the intermediate opening portion 23. In the present embodiment, the metallic ball 8 closes a part of the intermediate opening portion 23 (portion between both the end portions of the intermediate opening portion 23 in the longitudinal direction). The metallic ball 8 is made of, for example, copper.

The solder member 9 is disposed in the through-hole 20. The solder member 9 is disposed between the metallic film 7 and the metallic ball 8 in the through-hole 20, and fixes the metallic ball 8 in the through-hole 20. More specifically, the solder member 9 seals an area between the cylindrical portion 71 of the metallic film 7 and the metallic ball 8 in a state where the solder member 9 extends from the metallic ball 8 to the cylindrical portion 71 of the metallic film 7. When viewed in the Z-axis direction, the solder member 9 extends in an annular shape in the area between the cylindrical portion 71 of the metallic film 7 and the metallic ball 8. A surface 9a on the outside opening portion 22 side of the solder member 9 is a curved surface that is recessed to an inside opening portion 21 side in the area between the cylindrical portion 71 of the metallic film 7 and the metallic ball 8 (namely, has a fillet shape). In the present embodiment, the solder member 9 reaches the inside opening portion 21, and does not reach the outside opening portion 22. The solder member 9 is made of, for example, SnAgCu or AuSn.

Figure 15:
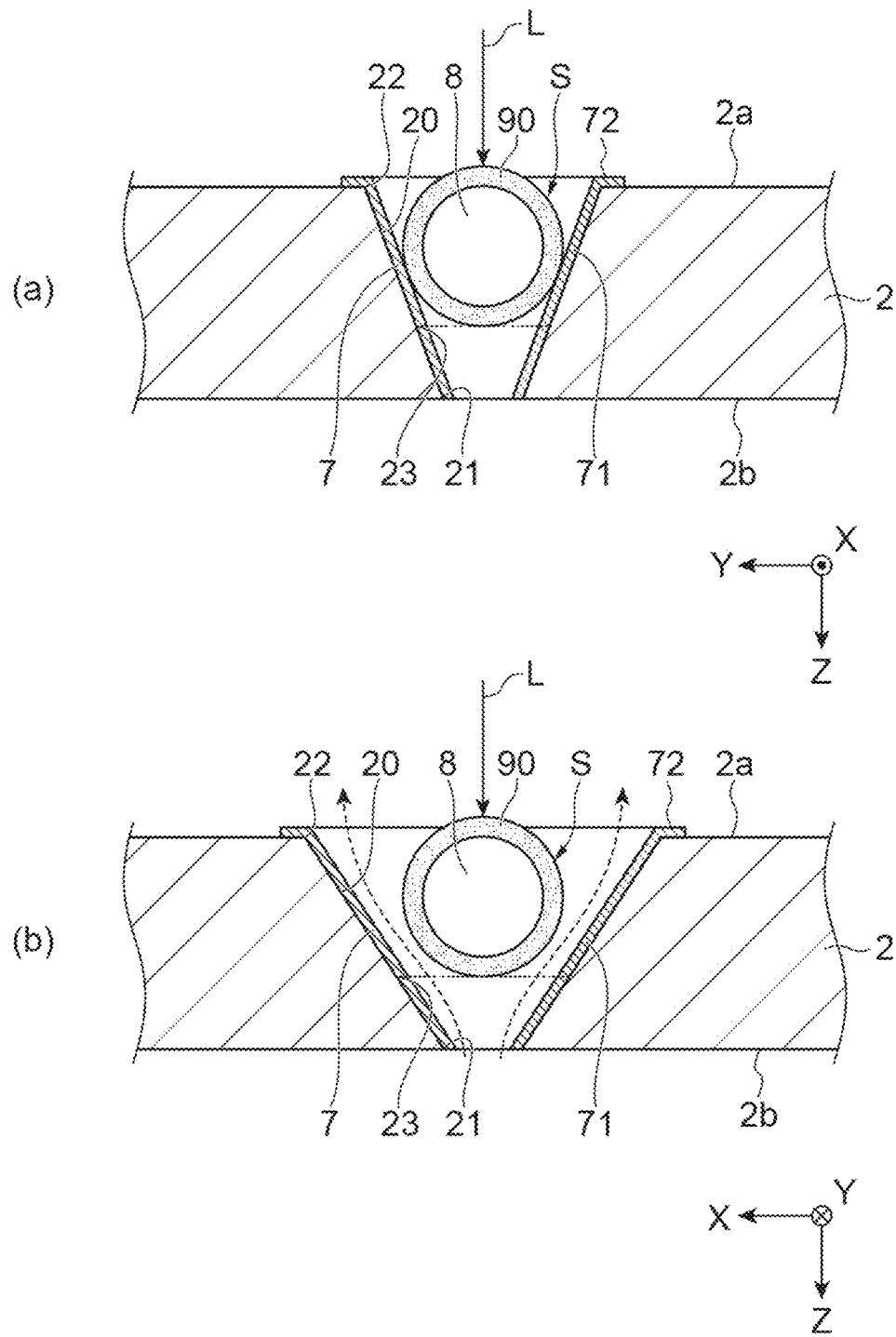
FIG. 15 provides views illustrating one step of a method for manufacturing the light-receiving device illustrated in FIG. 12.
Figure 16:
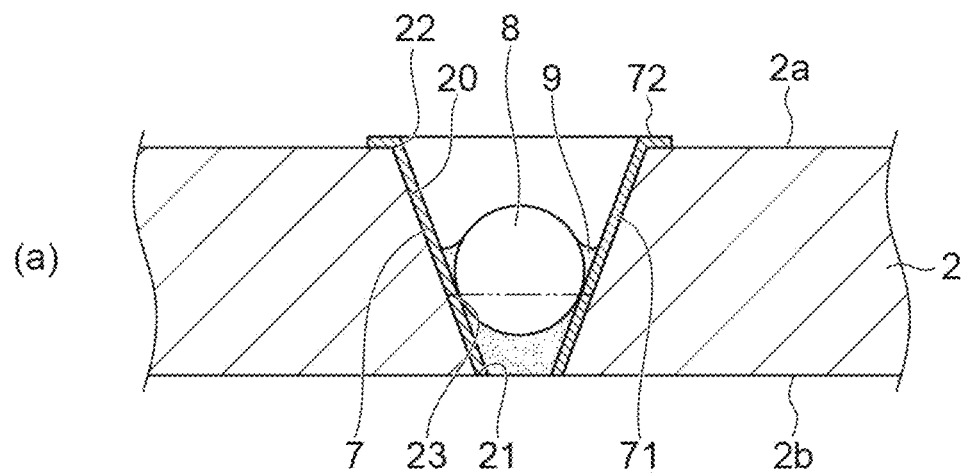
FIG. 16 provides views illustrating one step of the method for manufacturing the light-receiving device illustrated in FIG. 12.
Figure 16:
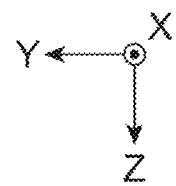
Figure 16:
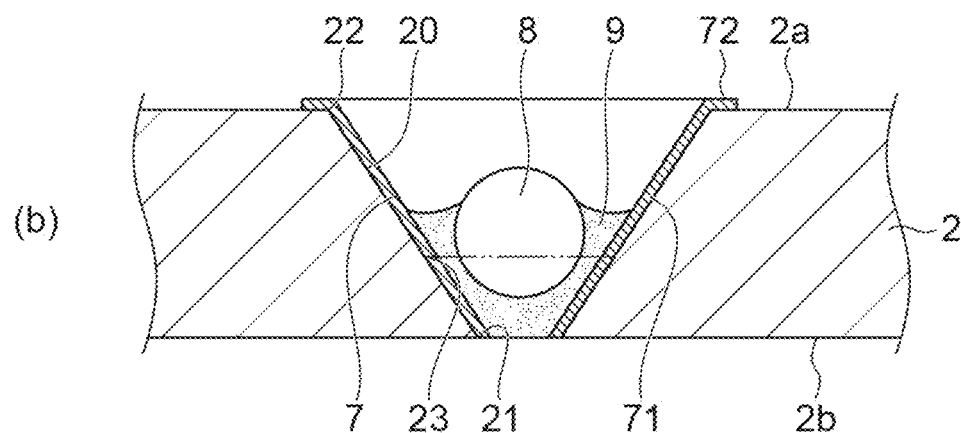
Figure 16:
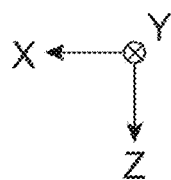

A method for manufacturing the light-receiving device 1C configured as described above will be described. Incidentally, FIG. 15(a) is a cross-sectional view of a portion of the printed wiring substrate 2, which includes the through-hole 20, taken in parallel with the Y-axis direction, and FIG. 15(b) is a cross-sectional view of a portion of the printed wiring substrate 2, which includes the through-hole 20, taken in parallel with the X-axis direction. In addition, FIG. 16(a) is a cross-sectional view of the portion of the printed wiring substrate 2, which includes the through-hole 20, taken in parallel with the Y-axis direction, and FIG. 16(b) is a cross-sectional view of the portion of the printed wiring substrate 2, which includes the through-hole 20, taken in parallel with the X-axis direction.

First, the light-receiving element 3 and the like are disposed on the inside surface 2a of the printed wiring substrate 2 by performing the first step and the second step in the method for manufacturing the light-receiving device 1A described above, so that the package P is formed by the printed wiring substrate (substrate) 2, the frame 4, and the glass cover 5 (fifth step). Before the light-receiving element 3 and the like are disposed on the inside surface 2a of the printed wiring substrate 2, the through-hole 20 is formed in the printed wiring substrate 2, and the metallic film 7 is provided on the inner surface 20a of the through-hole 20.

Subsequently, as illustrated in FIGS. 15(a) and 15(b), the package P (refer to FIG. 12) is disposed such that the outside surface 2b is located on an upper side with respect to the inside surface 2a, and a solder ball S is disposed in the through-hole 20 from the outside opening portion 22 (sixth step). The solder ball S is a solder ball with a core, which includes the metallic ball 8 and a solder layer 90 covering the metallic ball 8. The melting point of the metallic ball 8 is higher than the melting point of the solder layer 90. Subsequently, as illustrated in FIGS. 16(a) and 16(b), the solder member 9 is formed by melting the solder layer 90 (sixth step). In the present embodiment, as illustrated in FIGS. 15(a) and 15(b), the solder layer 90 is melted by irradiating the solder ball S with laser light L while degassing the inside of the package P through the through-hole 20.

Subsequently, the light-receiving device 1C is obtained by performing the third step in the method for manufacturing the light-receiving device 1A described above. Incidentally, after the third step in the method for manufacturing the light-receiving device 1A described above is performed, the sixth step described above may be performed.

Figure 17:
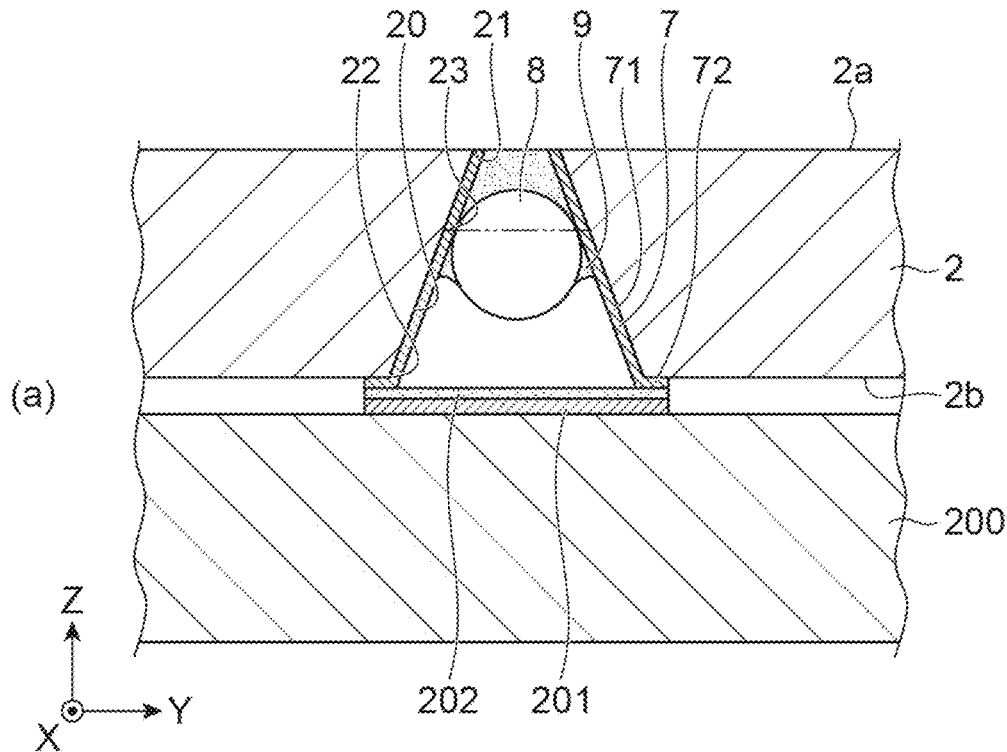
FIG. 17 provides views illustrating one step of a method for mounting the light-receiving device illustrated in FIG. 12.
Figure 17:
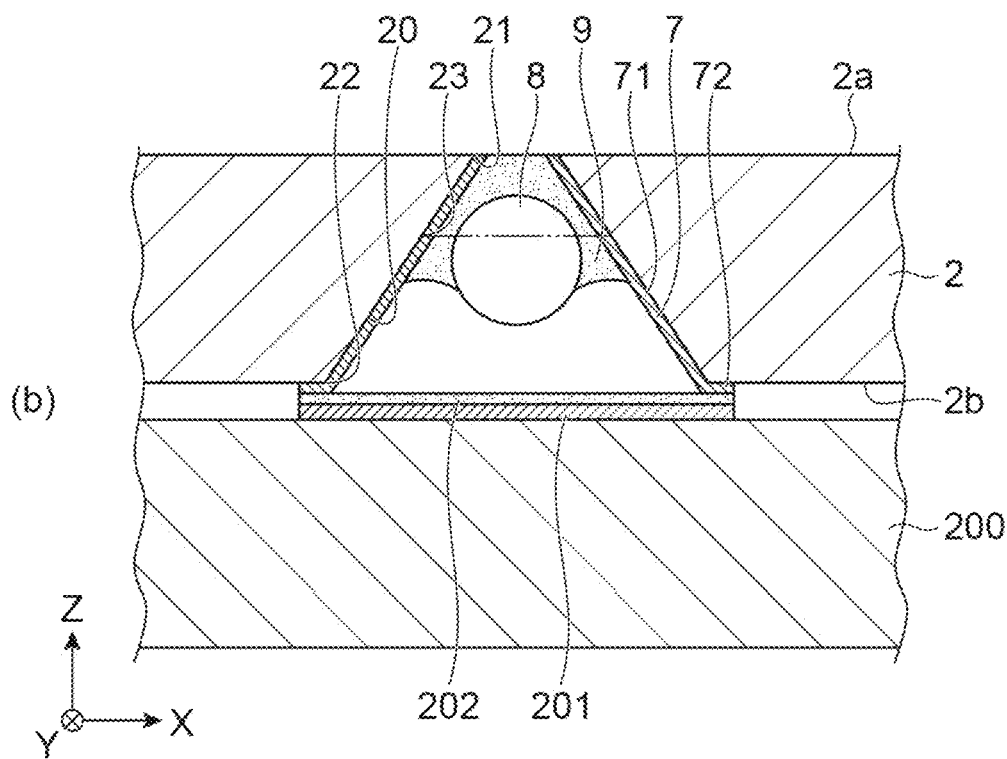

A method for mounting the light-receiving device 1C manufactured as described above will be described. Incidentally, FIG. 17(a) is a cross-sectional view of a portion of the printed wiring substrate 2, which includes the through-hole 20, taken in parallel with the Y-axis direction, and FIG. 17(b) is a cross-sectional view of a portion of the printed wiring substrate 2, which includes the through-hole 20, taken in parallel with the X-axis direction. In addition, FIG. 18(a) is a cross-sectional view of the portion of the printed wiring substrate 2, which includes the through-hole 20, taken in parallel with the Y-axis direction, and FIG. 18(b) is a cross-sectional view of the portion of the printed wiring substrate 2, which includes the through-hole 20, taken in parallel with the X-axis direction.

First, as illustrated in FIGS. 17(a) and 17(b), a mounting substrate 200 on which the light-receiving device 1C is to be mounted is prepared. The mounting substrate 200 is provided with a metallic pattern 201 corresponding to the outside opening portion 22 of the through-hole 20 and the flange portion 72 of the metallic film 7 in the light-receiving device 1C, and a solder layer 202 is provided on the metallic pattern 201. Subsequently, the printed wiring substrate 2 is disposed on the mounting substrate 200 such that the outside opening portion 22 and the flange portion 72 are located on the metallic pattern 201 with the solder layer 202 interposed therebetween.

Figure 18:
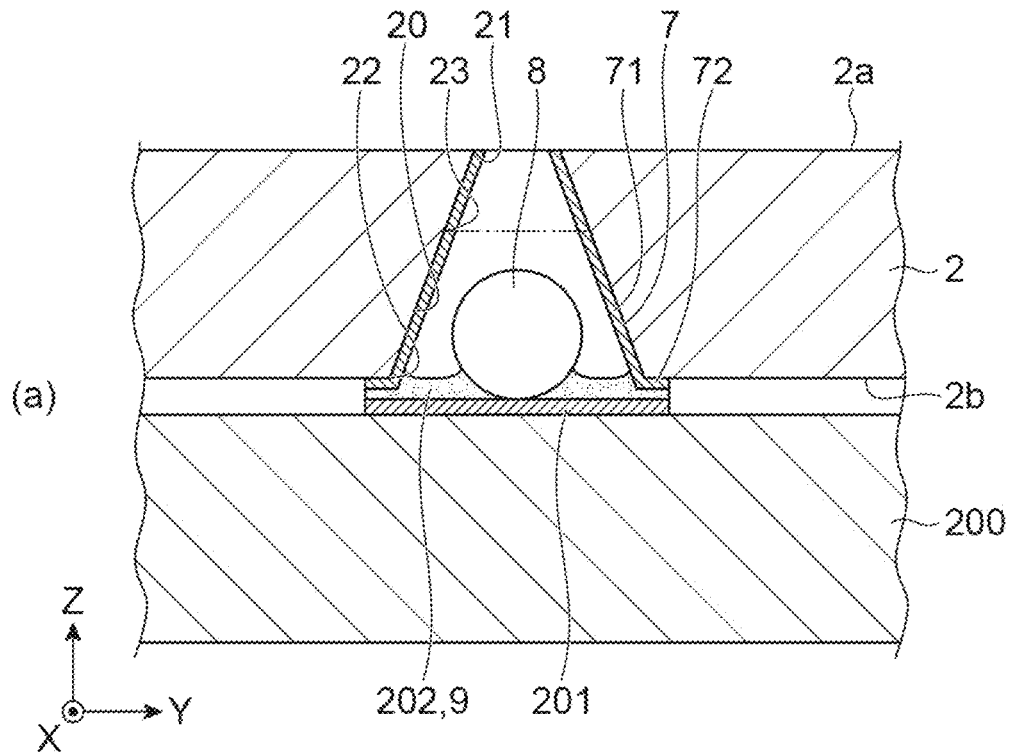
FIG. 18 provides views illustrating one step of the method for mounting the light-receiving device illustrated in FIG. 12.
Figure 18:
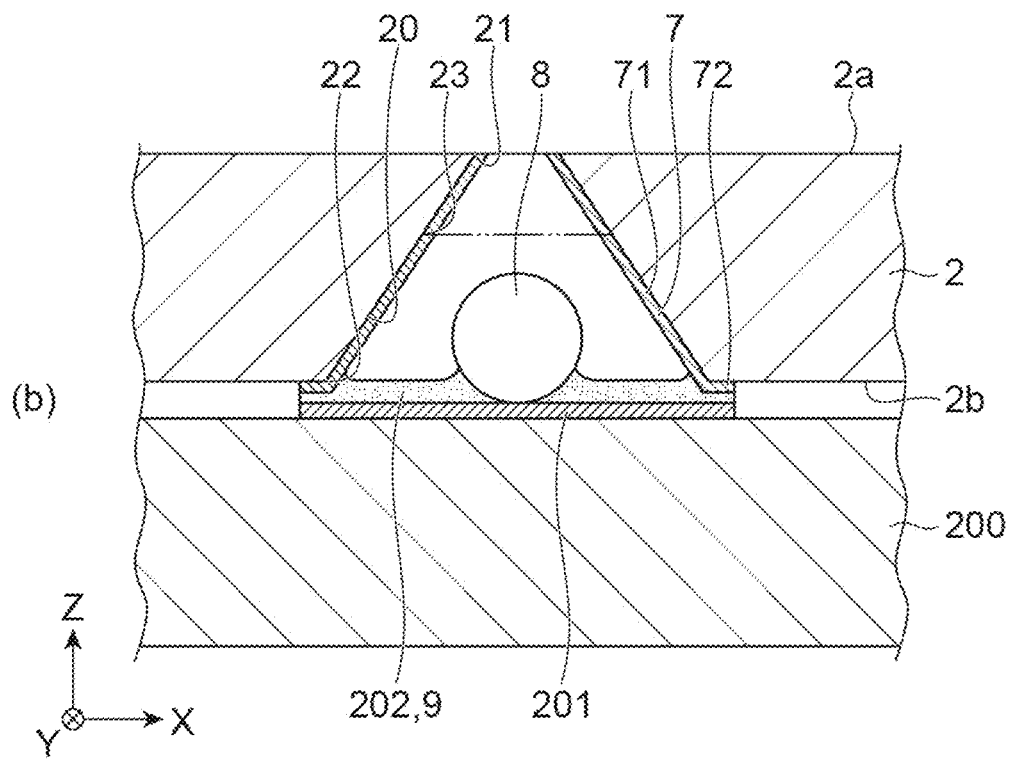

Subsequently, as illustrated in FIGS. 18(a) and 18(b), the flange portion 72 of the metallic film 7 is joined to the metallic pattern 201, for example, by melting the solder layer 202 in a heating furnace. At this time, when the solder member 9 (refer to FIGS. 17(a) and 17(b)) is melted, the molten solder member 9 contributes to the joining between the flange portion 72 and the metallic pattern 201. In addition, since the solder member 9 is melted, even when the metallic ball 8 falls on the metallic pattern 201, the metallic ball 8 is fixed on the metallic pattern 201 by the solder layer 202 and the solder member 9.

As described above, according to the light-receiving device 1C, during manufacturing of the light-receiving device 1C, for example, while degassing the inside of the package P through the through-hole 20, the metallic ball 8 can be fixed in the through-hole 20 by the solder member 9, and the area between the cylindrical portion 71 of the metallic film 7 and the metallic ball 8 can be sealed by the solder member 9. At this time, since at least a part of the intermediate opening portion 23 of the through-hole 20 is closed by the metallic ball 8, the molten solder member 9 can be suppressed from infiltrating into the package P. Further, the intermediate opening portion 23 of the through-hole 20 has a shape through which the metallic ball 8 is not passable, and in a state where the solder member 9 extends from the metallic ball 8 to the cylindrical portion 71 of the metallic film 7, the area between the cylindrical portion 71 of the metallic film 7 and the metallic ball 8 is sealed by the solder member 9. Accordingly, in the manufactured light-receiving device 1C, the fixed state of the metallic ball 8 is stabilized, so that the sealing state of the through-hole 20 can be reliably maintained.

In addition, in the light-receiving device 1C, the intermediate opening portion 23 of the through-hole 20 has a long shape. Accordingly, during manufacturing of the light-receiving device 1C, when the metallic ball 8 is fixed in the through-hole 20 by the solder member 9, a part of the intermediate opening portion 23 of the through-hole 20 (in the present embodiment, both the end portions of the intermediate opening portion 23 in the longitudinal direction) is not closed by the metallic ball 8, so that the inside of the package P can be reliably degassed through the through-hole 20.

In addition, in the light-receiving device 1C, the through-hole 20 is a tapered hole that widens from the inside surface 2a toward the outside surface 2b. Accordingly, the through-hole 20 including the outside opening portion 22 having a shape through which the metallic ball 8 is passable and the intermediate opening portion 23 having a shape through which the metallic ball 8 is not passable can be easily and reliably obtained.

In addition, in the light-receiving device 1C, the metallic film 7 includes the cylindrical portion 71 and the flange portion 72, and the cylindrical portion 71 is connected to the flange portion 72. Accordingly, for example, when the flange portion 72 of the metallic film 7 is joined to the metallic pattern 201 of the mounting substrate 200, even if the metallic ball 8 falls on the metallic pattern 201, the sealing state of the through-hole 20 in the light-receiving device 1C after mounting can be reliably maintained.

In addition, in the light-receiving device 1C, the surface 9a of the solder member 9 is a curved surface that is recessed to the inside opening portion 21 side in the area between the cylindrical portion 71 of the metallic film 7 and the metallic ball 8. Accordingly, the local concentration of stress can be suppressed from occurring in the solder member 9, and the sealing state of the through-hole 20 can be more reliably maintained.

In addition, according to the method for manufacturing the light-receiving device 1C, the through-hole 20 can be reliably sealed while suppressing the infiltration of the molten solder layer 90 into the package P.

In addition, in the method for manufacturing the light-receiving device 1C, the solder layer 90 is melted by irradiating the solder ball S with the laser light L. Accordingly, the solder layer 90 can be locally heated, so that thermal influence on the light-receiving device 1C and the like can be suppressed.

In addition, in the method for manufacturing the light-receiving device 1C, the solder layer 90 is melted while the inside of the package P is degassed through the through-hole 20. Accordingly, the inside of the package P can be reliably degassed through the through-hole 20 while suppressing the infiltration of the molten solder layer 90 into the package.

Modification Examples

Figure 19:
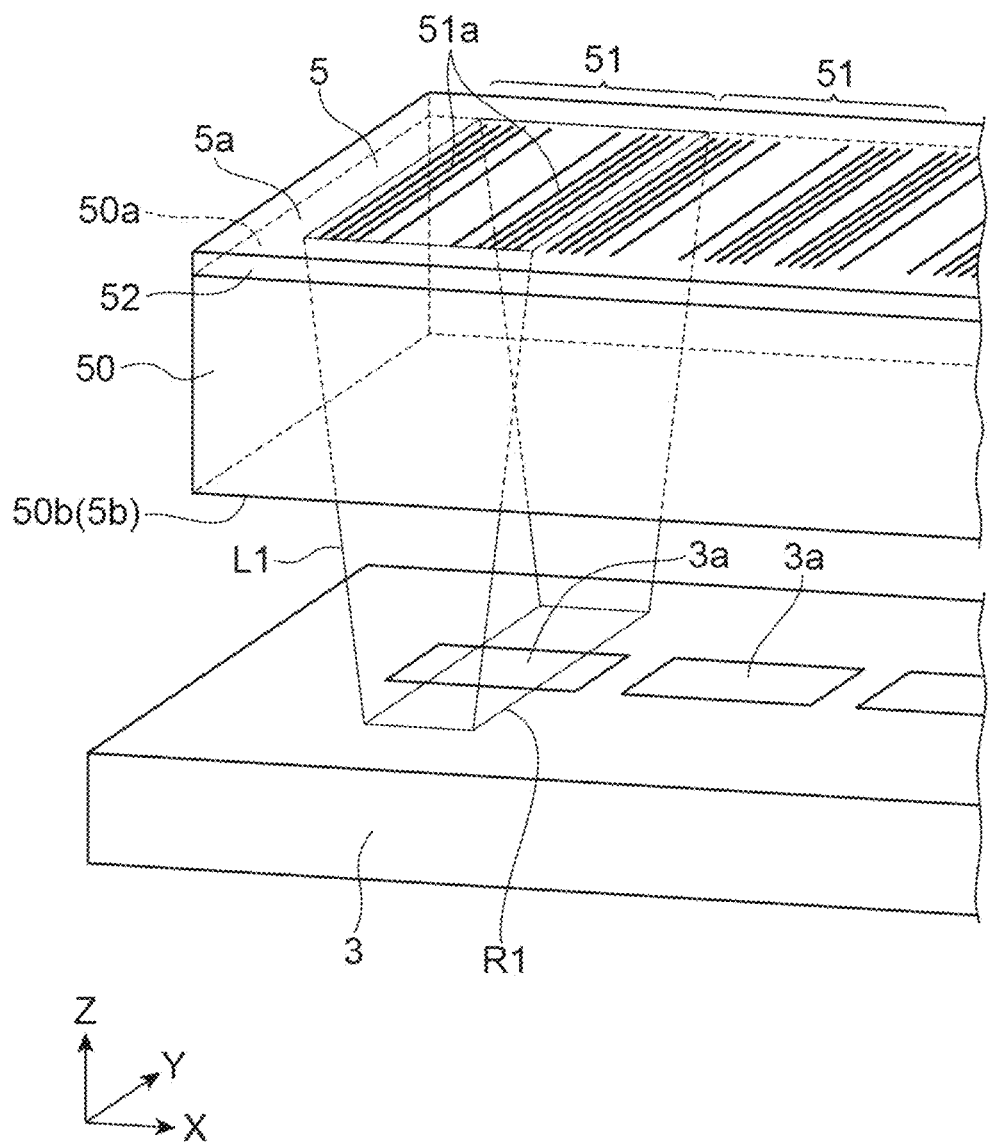
FIG. 19 is an enlarged view of a glass cover of a first modification example.

The present disclosure is not limited to the first embodiment, the second embodiment, and the third embodiment. For example, the glass substrate 50 is not limited to being disposed such that the surface 50a and the surface 50b are parallel with each other, and may be disposed such that the surface 50a is inclined with respect to the surface 50b. In each of the light-receiving devices 1A, 1B, and 1C, the plurality of diffraction gratings 51 may be formed inside the glass substrate 50. Also in this case, the influence of the irradiation of the laser light L2 for processing on the light-receiving element 3 can be suppressed. In addition, in each of the light-receiving devices 1A, 1B, and 1C, as illustrated in FIG. 19, the glass cover 5 may include the glass substrate 50 and a first film 52 provided on the surface 50a of the glass substrate 50, and the plurality of diffraction gratings 51 may be formed in the first film 52. Accordingly, the distance from the light-receiving element 3 to the plurality of diffraction gratings 51 can be set to an appropriate distance, and the laser light L1 for distance measurement incident on the glass cover 5 can be reliably concentrated on each of the plurality of light-receiving portions 3a. In the example illustrated in FIG. 19, a plurality of slits formed in the first film 52 form each of the diffraction gratings 51. In this case, in each of the diffraction gratings 51, an area in each slit corresponds to a refractive index change area, in which the refractive index is changed from a surrounding area, in the first film 52. Namely, in the example illustrated in FIG. 19, the refractive index change areas in which the transmittance of the laser light L1 for distance measurement is higher than in the first film 52 form the diffraction grating 51. The first film 52 is, for example, a SiN film.

In addition, in each of the light-receiving devices 1A, 1B, and 1C, the light-receiving element 3 may be an area sensor including the plurality of light-receiving portions 3a arranged in two dimensions.

As one example, when the plurality of light-receiving portions 3a are arranged in a matrix pattern having the X-axis direction as a row direction and the Y-axis direction as a column direction, each of the diffraction gratings 51 may include a first layer including the plurality of refractive index change areas 51a extending along the X-axis direction and a second layer including the plurality of refractive index change areas 51a extending along the Y-axis direction. In the first layer, when the plurality of refractive index change areas 51a are formed such that the distance between the adjacent refractive index change areas 51a decreases from the center toward both sides in the Y-axis direction, the laser light L1 for distance measurement incident in parallel with the Z-axis direction can be concentrated in a plane perpendicular to the X-axis direction. In the second layer overlapping the first layer when viewed in the Z-axis direction, when the plurality of refractive index change areas 51a are formed such that the distance between the adjacent refractive index change areas 51a decreases from the center toward both sides in the X-axis direction, the laser light L1 for distance measurement incident in parallel with the Z-axis direction can be concentrated in a plane perpendicular to the Y-axis direction. Therefore, the laser light L1 for distance measurement can be reliably concentrated on each of the plurality of light-receiving portions 3a arranged in a matrix pattern.

In addition, as one example, when the plurality of light-receiving portions 3a are arranged in a matrix pattern having the X-axis direction as a row direction and the Y-axis direction as a column direction, each of the diffraction gratings 51 may be formed of the plurality of refractive index change areas 51a that are concentrically formed. When the plurality of refractive index change areas 51a are formed such that the distance between the adjacent refractive index change areas 51a decreases from the center toward an outer side, the laser light L1 for distance measurement can be reliably concentrated on each of the plurality of light-receiving portions 3a arranged in a matrix pattern.

In addition, in the light-receiving device 1B, the glass cover 5 may be fixed on the light-receiving element 3 by direct bonding. In this case, in the method for manufacturing the light-receiving device 1B, in the second step, the glass wafer 5W is fixed on the semiconductor wafer 3W by direct bonding. Examples of the direct bonding include plasma activation bonding, surface-activated room-temperature bonding (SAB), atomic diffusion bonding (ADB), anodic bonding, fusion bonding, hydrophilic bonding, and the like.

In addition, each of the light-receiving devices 1A, 1B, and 1C may include the light source 10 that emits the laser light L1 for distance measurement. Accordingly, the distance to the object A can be accurately measured.

In addition, in the method for manufacturing each of the light-receiving devices 1A, 1B, and 1C, as illustrated in FIG. 19, when the glass cover 5 includes the glass substrate 50 and the first film 52 provided on the surface 50a of the glass substrate 50, the plurality of diffraction gratings 51 may be formed in the first film 52 by irradiating the glass cover 5 with the laser light L2 for processing. Accordingly, while suppressing the influence of the irradiation of the laser light L2 for processing on the light-receiving devices 1A, 1B, and 1C, a plurality of light-concentrating elements can be easily provided in the glass cover 5 by the irradiation of the laser light L2 for processing.

Figure 20:
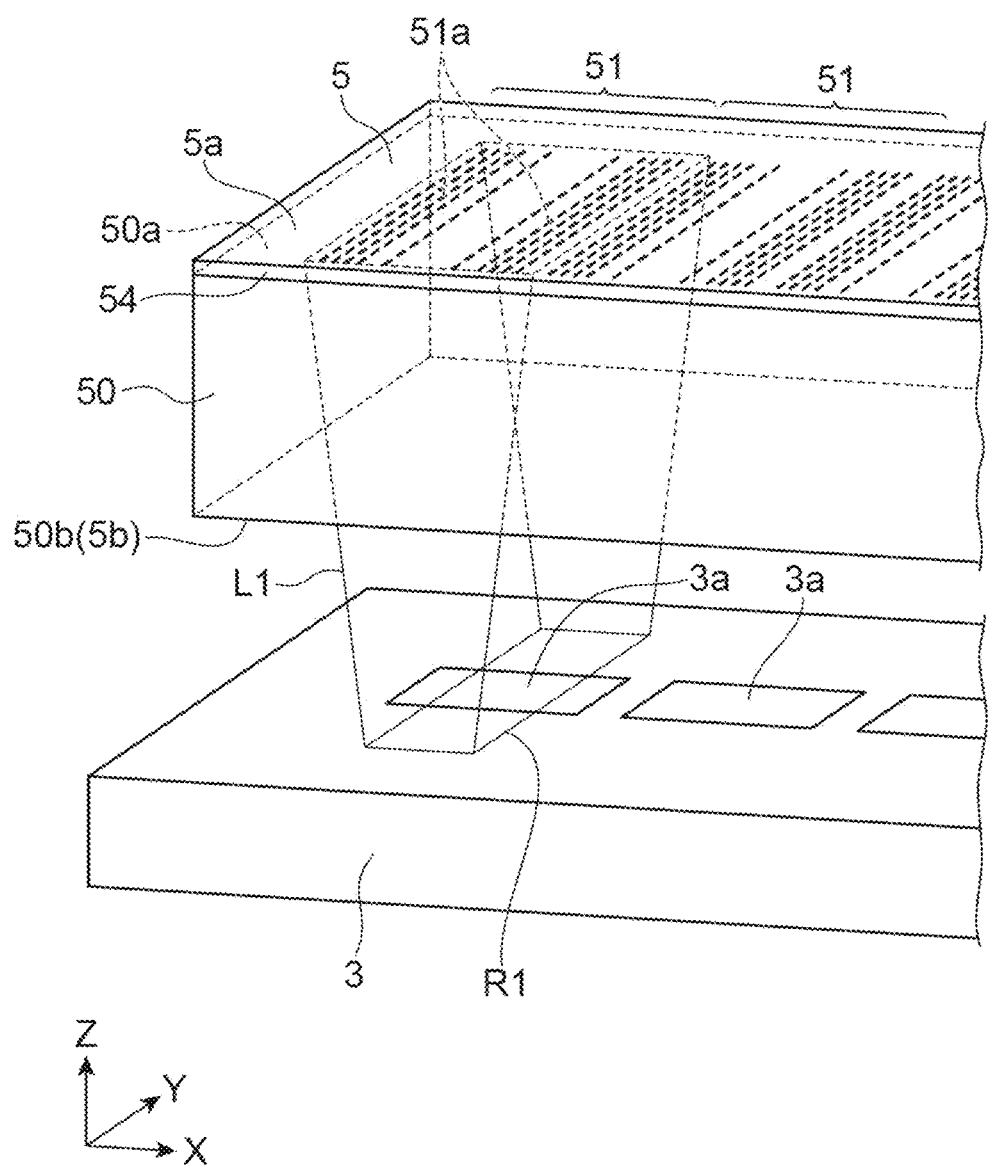
FIG. 20 is an enlarged view of a glass cover of a second modification example.

In addition, in each of the light-receiving devices 1A, 1B, and 1C, as illustrated in FIG. 20, the glass cover 5 may further include a filter 54 disposed on a side opposite to the light-receiving element 3 with respect to the plurality of diffraction gratings 51. The filter 54 may have transmission properties for the laser light L1 for distance measurement, and have light shielding properties for light having wavelengths other than the wavelength of the laser light L1 for distance measurement. In the filter 54, the transmittance of the laser light L1 for distance measurement is higher than the transmittance of the light having the wavelengths other than the wavelength of the laser light L1 for distance measurement. In such a manner, since the filter 54 is provided in a previous stage of the plurality of diffraction gratings 51, the light having the wavelengths other than the wavelength of the laser light L1 for distance measurement can be reliably cut, and the SN ratio of the light-receiving element 3 can be improved. As one example, the filter 54 is a bandpass filter having transmission properties for the laser light L1 for distance measurement and having light shielding properties for light having wavelengths other than the wavelength of the laser light L1 for distance measurement.

Figure 21:
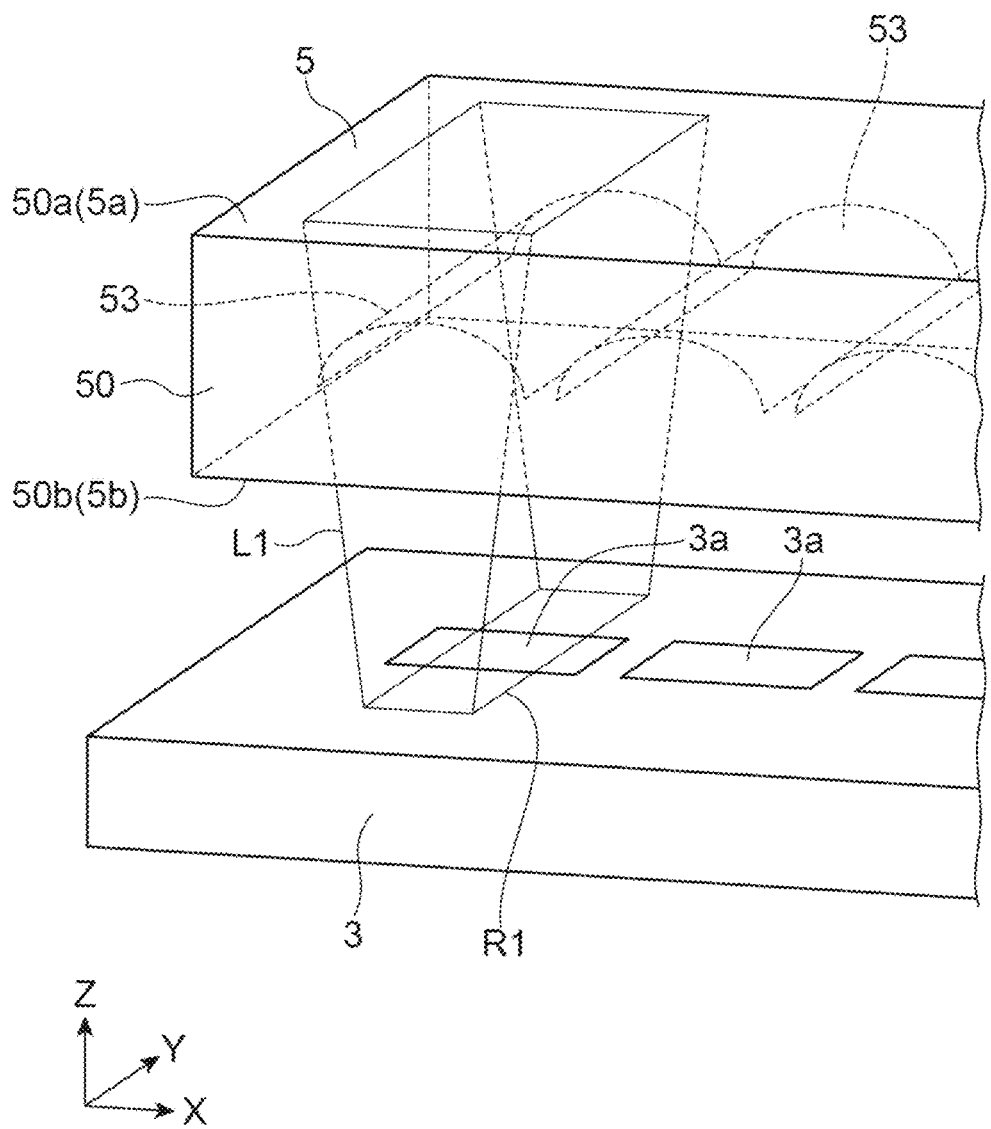
FIG. 21 is an enlarged view of a glass cover of a third modification example.
Figure 22:
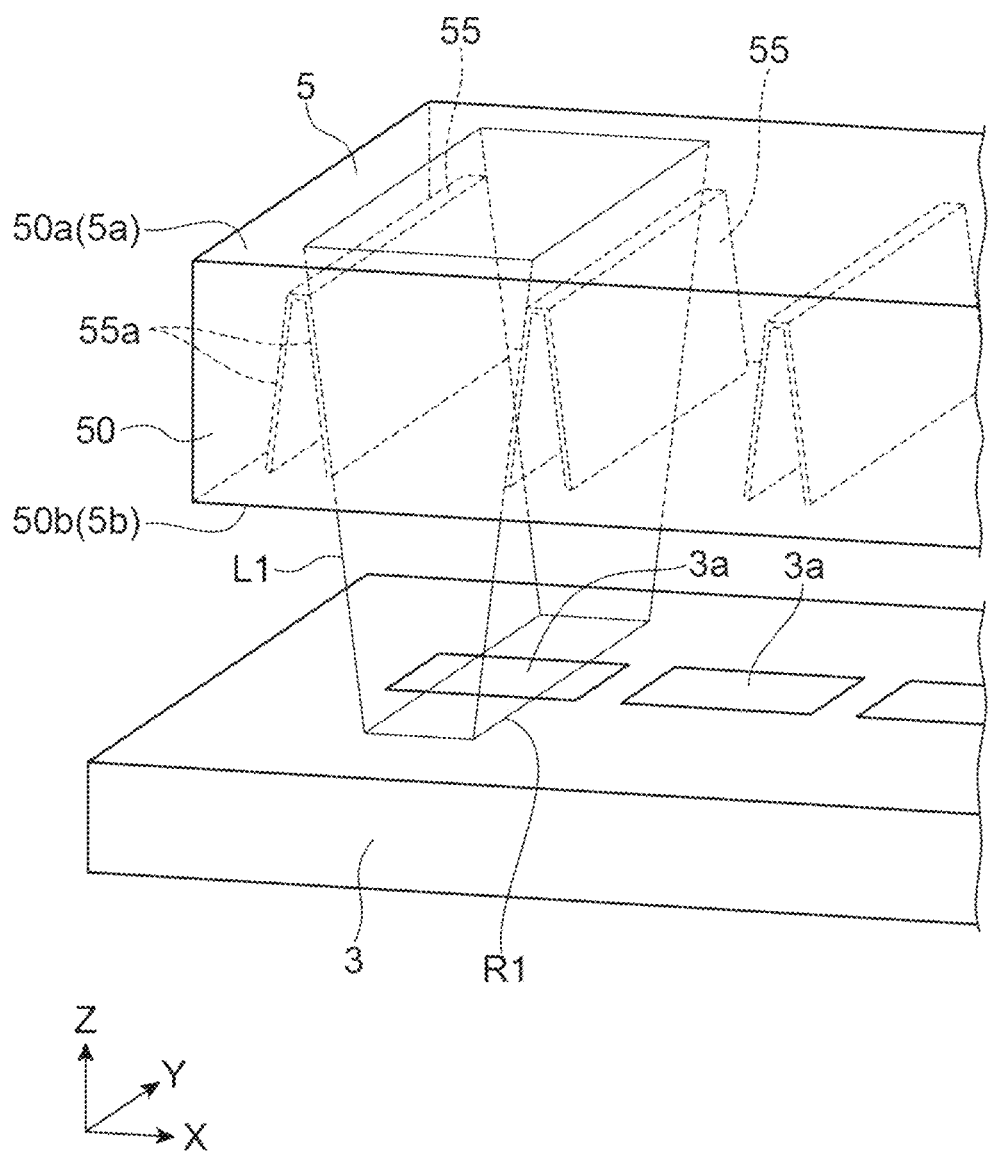
FIG. 22 is an enlarged view of a glass cover of a fourth modification example.

In addition, in the method for manufacturing each of the light-receiving devices 1A, 1B, and 1C, the plurality of diffraction gratings (light-concentrating elements) 51 may be formed inside the glass substrate 50 by irradiating the glass cover 5 with the laser light L2 for processing. In addition, instead of the plurality of diffraction gratings 51, as illustrated in FIG. 21, a plurality of lens surfaces (light-concentrating elements) 53 may be formed. In the example illustrated in FIG. 21, each of the lens surfaces 53 is a cylindrical lens surface that concentrates the laser light L1 for distance measurement, which is incident in parallel with the Z-axis direction, only in a plane perpendicular to the Y-axis direction. In addition, instead of the plurality of diffraction gratings 51, as illustrated in FIG. 22, a plurality of light-guiding portions (light-concentrating elements) 55 may be formed. In the example illustrated in FIG. 22, each of the light-guiding portions 55 is formed of a pair of light-guiding areas 55a which are formed to face each other in the X-axis direction and such that the interval therebetween decreases as the pair of light-guiding portions 55 approach the light-receiving portion 3a. In such a manner, in the method for manufacturing each of the light-receiving devices 1A, 1B, and 1C, appropriate light-concentrating elements according to the application may be provided in the glass cover 5. Incidentally, each of the above-described light-concentrating elements is formed of a refractive index change area, in which the refractive index is changed from a surrounding area, inside the glass substrate 50.

Figure 23:
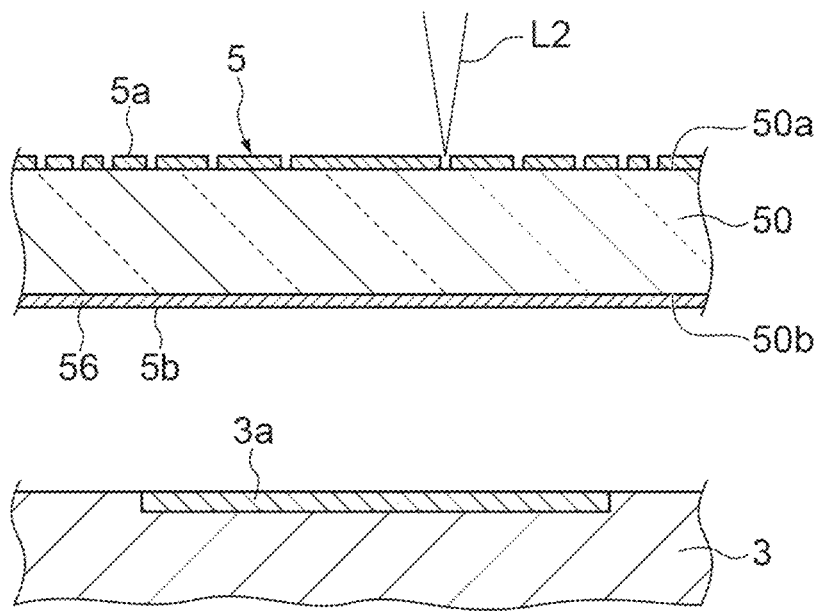
FIG. 23 provides cross-sectional views of a glass cover of a fifth modification example and a glass cover of a sixth modification example.
Figure 23:
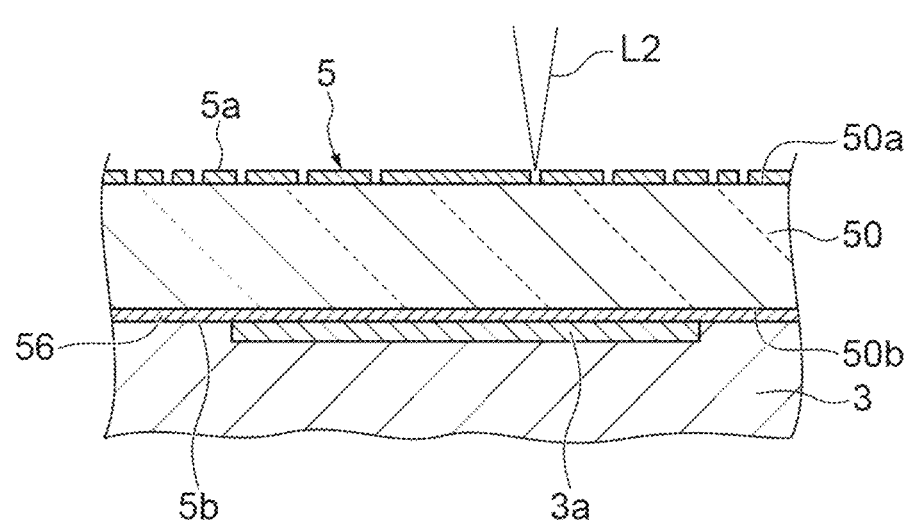

In addition, in the method for manufacturing each of the light-receiving devices 1A, 1B, and 1C, as illustrated in FIGS. 23(a) and 23(b), the glass cover 5 may include the glass substrate 50 and a second film 56 provided on the surface 50b of the glass substrate 50. The second film 56 may have transmission properties for the laser light L1 for distance measurement and have light shielding properties for the laser light L2 for processing. In the second film 56, the transmittance of the laser light L1 for distance measurement is higher than the transmittance of the laser light L2 for processing. Accordingly, the influence of the irradiation of the laser light L2 for processing on the light-receiving element 3 can be more reliably suppressed.

Incidentally, the second film 56 may be a film that absorbs the laser light L2 for processing, or a film that reflects the laser light L2 for processing. As one example, the second film 56 is a bandpass filter having transmission properties for the laser light L1 for distance measurement and having light shielding properties for the laser light L2 for processing.

In addition, in the method for manufacturing each of the light-receiving devices 1A, 1B, and 1C, the glass cover 5 may include the glass substrate 50, and the glass substrate 50 may have transmission properties for the laser light L1 for distance measurement and have light shielding properties for the laser light L2 for processing. In this case, the transmittance of the laser light L1 for distance measurement in the glass substrate 50 is higher than the transmittance of the laser light L2 for processing in the glass substrate 50. Accordingly, the influence of the irradiation of the laser light L2 for processing on the light-receiving element 3 can be more reliably suppressed. As one example, the glass substrate 50 is a glass substrate containing a pigment having higher absorption for the laser light L2 for processing than for the laser light L1 for distance measurement.

In addition, in the method for manufacturing each of the light-receiving devices 1A, 1B, and 1C, a plurality of light-concentrating elements may be formed in the glass cover 5 by irradiating the glass cover 5 with the laser light L2 for processing in a state where the glass cover 5 is disposed above the light-receiving element 3, and thereafter, the glass cover 5 may be fixed on the light-receiving element 3.

Figure 24:
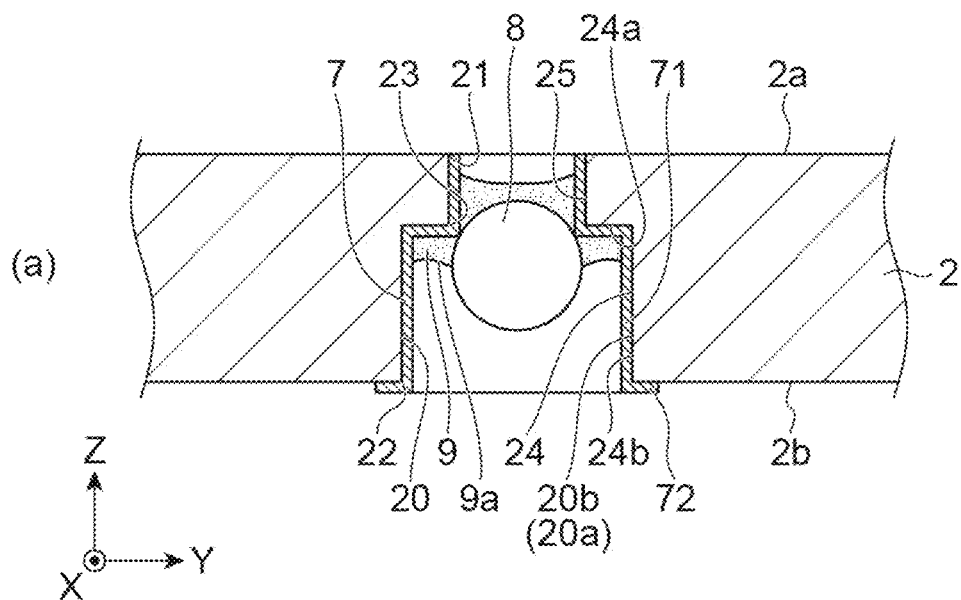
FIG. 24 provides cross-sectional views of a portion of a printed wiring substrate of a light-receiving device of a modification example.
Figure 24:
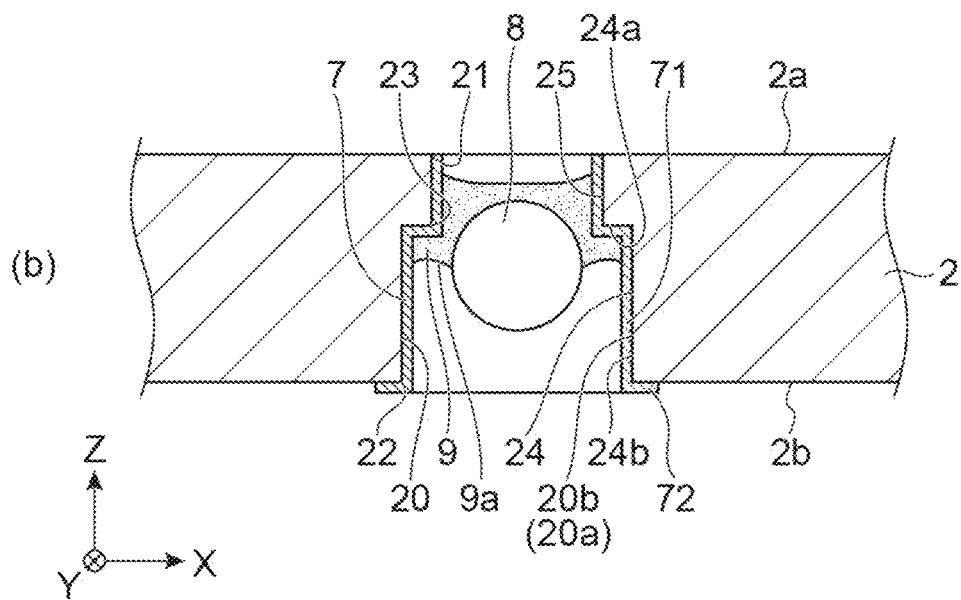

In addition, in the light-receiving device 1C, as illustrated in FIGS. 24(a) and 24(b), the through-hole 20 formed in the printed wiring substrate 2 may be a stepped hole that is widened in width on an outside surface 2b side. Incidentally, FIG. 24(a) is a cross-sectional view of a portion of the printed wiring substrate 2, which includes the through-hole 20, taken in parallel with the Y-axis direction, and FIG. 24(b) is a cross-sectional view of a portion of the printed wiring substrate 2, which includes the through-hole 20, taken in parallel with the X-axis direction.

In the example illustrated in FIGS. 24(a) and 24(b) (hereinafter, referred to as the "light-receiving device 1C of a modification example"), a recessed portion 24 formed in the outside surface 2b and a hole portion 25 formed in a bottom surface 24a of the recessed portion 24 form the through-hole 20. In the light-receiving device 1C of the modification example, an opening portion of the hole portion 25 which is located in the inside surface 2a corresponds to the inside opening portion 21 of the through-hole 20, an opening portion of the recessed portion 24 which is located in the outside surface 2b corresponds to the outside opening portion 22 of the through-hole 20, and an opening portion of the hole portion 25 which is located in the bottom surface 24a of the recessed portion 24 corresponds to the intermediate opening portion 23 of the through-hole 20.

In such a manner, even when the through-hole 20 is a stepped hole, the through-hole 20 including the outside opening portion 22 having a shape through which the metallic ball 8 is passable and the intermediate opening portion 23 having a shape through which the metallic ball 8 is not passable can be easily and reliably obtained.

Figure 25:
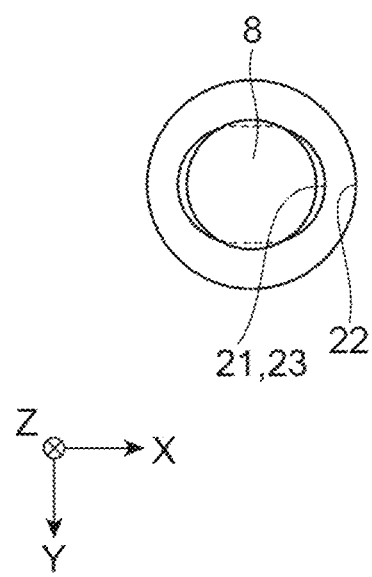
FIG. 25 is a bottom view of a portion of the printed wiring substrate illustrated in FIG. 24.

The light-receiving device 1C of the modification example will be described in more detail. As illustrated in FIG. 25, the outside opening portion 22 has a shape through which the metallic ball 8 is passable. The intermediate opening portion 23 has a shape through which the metallic ball 8 is not passable. In the light-receiving device 1C of the modification example, the intermediate opening portion 23 has a long shape having one direction as a longitudinal direction. When viewed in the Z-axis direction, both end portions of the intermediate opening portion 23 in the longitudinal direction do not overlap the metallic ball 8. The shape of the inside opening portion 21 is arbitrary.

As one example, each of the inside opening portion 21 and the intermediate opening portion 23 has an oval shape having the X-axis direction as a longitudinal direction, and the outside opening portion 22 has a circular shape. In the light-receiving device 1C of the modification example, the inside opening portion 21 and the intermediate opening portion 23 have the same shape. When viewed in the Z-axis direction, the inside opening portion 21 and the intermediate opening portion 23 are located inside the outside opening portion 22. Incidentally, in FIG. 25, the metallic film 7 and the solder member 9 are not illustrated.

As illustrated in FIGS. 24(a) and 24(b), the metallic film 7 is provided on the inner surface 20a of the through-hole 20. The metallic film 7 includes the cylindrical portion 71 and the flange portion 72. The cylindrical portion 71 is provided on the side surface 20b (namely, a side surface 24b on a recessed portion 24 side) of the inner surface 20a of the through-hole 20, the side surface 20b being located between the outside opening portion 22 and the intermediate opening portion 23. The flange portion 72 is provided on the outside surface 2b of the printed wiring substrate 2 to extend along an outer edge of the outside opening portion 22. The cylindrical portion 71 is connected to the flange portion 72. In the light-receiving device 1C of the modification example, the metallic film 7 reaches the inside opening portion 21.

The metallic ball 8 is disposed in the through-hole 20. The metallic ball 8 is disposed in the through-hole 20 to be surrounded by the cylindrical portion 71 of the metallic film 7. More specifically, a portion on an outside opening portion 22 side of the metallic ball 8 is surrounded by the cylindrical portion 71 of the metallic film 7. The metallic ball 8 has a spherical shape. The center of the metallic ball 8 is located between the outside opening portion 22 and the intermediate opening portion 23. In the light-receiving device 1C of the modification example, the metallic ball 8 closes a part of the intermediate opening portion 23 (portion between both the end portions of the intermediate opening portion 23 in the longitudinal direction).

The solder member 9 is disposed in the through-hole 20. The solder member 9 is disposed between the metallic film 7 and the metallic ball 8 in the through-hole 20, and fixes the metallic ball 8 in the through-hole 20. More specifically, the solder member 9 seals an area between the cylindrical portion 71 of the metallic film 7 and the metallic ball 8 in a state where the solder member 9 extends from the metallic ball 8 to the cylindrical portion 71 of the metallic film 7. When viewed in the Z-axis direction, the solder member 9 extends in an annular shape in the area between the cylindrical portion 71 of the metallic film 7 and the metallic ball 8. The surface 9a on the outside opening portion 22 side of the solder member 9 is a curved surface that is recessed to the inside opening portion 21 side in the area between the cylindrical portion 71 of the metallic film 7 and the metallic ball 8. In the light-receiving device 1C of the modification example, the solder member 9 does not reach each of the inside opening portion 21 and the outside opening portion 22. Meanwhile, a part of the solder member 9 is also disposed in the hole portion 25.

The same effects as those of the light-receiving device 1C of the third embodiment described above are exhibited by the light-receiving device 1C of the modification example.

Incidentally, in the light-receiving device 1C of the third embodiment and the light-receiving device 1C of the modification example, the substrate on which the light-receiving element 3 is disposed may be a substrate other than the printed wiring substrate 2, such as a substrate made of, for example, ceramic, plastic, or the like. In addition, in the light-receiving device 1C of the third embodiment and the light-receiving device 1C of the modification example, the substrate on which the light-receiving element 3 is disposed may include a portion corresponding to the frame 4.

In addition, in the light-receiving device 1C of the third embodiment and the light-receiving device 1C of the modification example, when the intermediate opening portion 23 has a long shape, the shape of the intermediate opening portion 23 is not limited to an oval shape, and may be an elliptical shape, a rectangular shape, or the like. In addition, in the light-receiving device 1C of the third embodiment and the light-receiving device 1C of the modification example, the intermediate opening portion 23 may not have a long shape as long as the intermediate opening portion 23 has a shape through which the metallic ball 8 is not passable. In addition, in the light-receiving device 1C of the third embodiment and the light-receiving device 1C of the modification example, the through-hole 20 may be a hole other than a tapered hole and a stepped hole.

In addition, in the light-receiving device 1C of the third embodiment and the light-receiving device 1C of the modification example, the metallic film 7 may not include the flange portion 72. In addition, in the light-receiving device 1C of the third embodiment and the light-receiving device 1C of the modification example, the metallic film 7 may not reach the inside opening portion 21.

In addition, in the light-receiving device 1C of the third embodiment and the light-receiving device 1C of the modification example, the solder member 9 may not cover a portion on the outside opening portion 22 side of the metallic ball 8, or may cover the portion. In addition, in the light-receiving device 1C of the third embodiment and the light-receiving device 1C of the modification example, a part of the solder member 9 may exist between the metallic ball 8 and the intermediate opening portion 23, or the metallic ball 8 may be in contact with the intermediate opening portion 23.

In addition, in the method for manufacturing each of the light-receiving device 1C of the third embodiment and the light-receiving device 1C of the modification example, when the solder layer 90 is melted, the inside of the package P may not be degassed through the through-hole 20. In that case, when the package P is formed, damage to the package P caused by the expansion of gas inside the package P can be suppressed. In addition, in the method for manufacturing each of the light-receiving device 1C of the third embodiment and the light-receiving device 1C of the modification example, the solder layer 90 may be melted in a heating furnace.

As a reference, the configurations related to the through-hole 20 are applicable to a substrate in which at least one of a light-receiving element and a light-emitting element is disposed in a package that houses at least one of the light-receiving element and light-emitting element. In that case, an optical device includes at least one of a light-receiving element and a light-emitting element, and a substrate including an inside surface on which at least one of the light-receiving element and the light-emitting element is disposed, an outside surface opposite to the inside surface, and a through-hole being open to the inside surface and the outside surface. The optical device includes a package that houses at least one of the light-receiving element and the light-emitting element, a metallic film provided on an inner surface of the through-hole, a metallic ball disposed in the through-hole, and a solder member that is disposed between the metallic film and the metallic ball in the through-hole and that fixes the metallic ball in the through-hole. In the optical device, the through-hole includes an inside opening portion located in the inside surface, an outside opening portion located in the outside surface, and an intermediate opening portion located between the inside surface and the outside surface. The outside opening portion has a shape through which the metallic ball is passable, and the intermediate opening portion has a shape through which the metallic ball is not passable. The metallic film includes a cylindrical portion provided on a side surface of the inner surface of the through-hole, the side surface being located between the outside opening portion and the intermediate opening portion. The metallic ball is disposed in the through-hole to be surrounded by the cylindrical portion. A solder member seals an area between the cylindrical portion and the metallic ball in a state where the solder member extends from the metallic ball to the cylindrical portion.

REFERENCE SIGNS LIST 1A, 1B, 1C: light-receiving device, 2: printed wiring substrate (substrate), 2a: inside surface, 2b: outside surface, 3: light-receiving element, 3a: light-receiving portion, 3W: semiconductor wafer, 5: glass cover, 5a: first surface, 5b: second surface, 5W: glass wafer, 7: metallic film, 8: metallic ball, 9: solder member, 9a: surface, 10: light source, 20: through-hole, 20a: inner surface, 20b: side surface, 21: inside opening portion, 22: outside opening portion, 23: intermediate opening portion, 50: glass substrate, 50a: surface, 50b: surface, 51: diffraction grating (light-concentrating element), 52: first film, 53: lens surface (light-concentrating element), 54: filter, 55: light-guiding portion (light-concentrating element), 56: second film, 71: cylindrical portion, 72: flange portion, 90: solder layer, A: object, L1: laser light for distance measurement, L2: laser light for processing, L: laser light, P: package, S: solder ball.

The invention claimed is:

1. A method for manufacturing a light-receiving device, the method comprising:
   a first step of preparing a light-receiving element in which a plurality of light-receiving portions are provided, and a glass cover having a first surface and a second surface opposite to the first surface;
   a second step of disposing the glass cover above the light-receiving element such that the second surface faces the light-receiving element, after the first step; and
   a third step of forming a plurality of light-concentrating elements in the glass cover by irradiating the glass cover with laser light for processing after the second step,
   wherein in the third step, the plurality of light-concentrating elements are formed such that each of the plurality of light-concentrating elements concentrates laser light for distance measurement on each of the plurality of light-receiving portions, the laser light for distance measurement incident on the first surface of the glass cover.

2. The method for manufacturing a light-receiving device according to claim 1,
   wherein in the second step, the glass cover is fixed above the light-receiving element such that the glass cover is separated from the light-receiving element.

3. The method for manufacturing a light-receiving device according to claim 1,
   wherein in the second step, the glass cover is fixed on the light-receiving element such that the glass cover is in contact with the light-receiving element.

4. The method for manufacturing a light-receiving device according to claim 1,
   wherein the glass cover includes a glass substrate and a first film provided on a surface on a first surface side of the glass substrate, and
   in the third step, the plurality of light-concentrating elements are formed in the first film.

5. The method for manufacturing a light-receiving device according to claim 4,
   wherein the plurality of light-concentrating elements are a plurality of diffraction gratings.

6. The method for manufacturing a light-receiving device according to claim 1,
   wherein the glass cover includes a glass substrate, and
   in the third step, the plurality of light-concentrating elements are formed in the glass substrate.

7. The method for manufacturing a light-receiving device according to claim 6,
   wherein in the third step, the plurality of light-concentrating elements are formed in a surface on a first surface side of the glass substrate.

8. The method for manufacturing a light-receiving device according to claim 7, wherein the plurality of light-concentrating elements are a plurality of diffraction gratings.

9. The method for manufacturing a light-receiving device according to claim 6,
wherein in the third step, the plurality of light-concentrating elements are formed inside the glass substrate.

10. The method for manufacturing a light-receiving device according to claim 9,
wherein the plurality of light-concentrating elements are a plurality of diffraction gratings, a plurality of lens surfaces, or a plurality of light-guiding portions.

11. The method for manufacturing a light-receiving device according to claim 1,
wherein the glass cover includes a glass substrate and a second film provided on a surface on a second surface side of the glass substrate, and
the second film has transmission properties for the laser light for distance measurement, and has light shielding properties for the laser light for processing.

12. The method for manufacturing a light-receiving device according to claim 1,
wherein the glass cover includes a glass substrate, and the glass substrate has transmission properties for the laser light for distance measurement, and has light shielding properties for the laser light for processing.

13. The method for manufacturing a light-receiving device according to claim 1,
wherein in the first step, a semiconductor wafer including a plurality of portions that become the light-receiving elements, and a glass wafer including a plurality of portions that become the glass covers are prepared,
in the second step, the glass wafer is fixed on the semiconductor wafer, and
in the third step, the plurality of light-concentrating elements are formed for each of the portions, which become the light-receiving elements, by irradiating the glass wafer with the laser light for processing.

14. The method for manufacturing a light-receiving device according to claim 13, further comprising:
a fourth step of cutting the semiconductor wafer and the glass wafer for each of the portions, which become the light-receiving elements, after the third step.

* * * * *